(12) United States Patent
Sakai et al.

(10) Patent No.: US 7,417,259 B2
(45) Date of Patent: Aug. 26, 2008

(54) LIGHT-EMITTING DEVICE HAVING LIGHT-EMITTING ELEMENTS

(75) Inventors: Shiro Sakai, Tokushima (JP); Jin-Ping Ao, Tokushima (JP); Yasuo Ono, Tokushima (JP)

(73) Assignee: Seoul Semiconductor Co., Ltd., Seoul (KR)

(*) Notice: Subject to any disclaimer, the term of this patent is extended or adjusted under 35 U.S.C. 154(b) by 0 days.

(21) Appl. No.: 10/525,998

(22) PCT Filed: Aug. 28, 2003

(86) PCT No.: PCT/JP03/10922

§ 371 (c)(1),
(2), (4) Date: Feb. 28, 2005

(87) PCT Pub. No.: WO2004/023568

PCT Pub. Date: Mar. 18, 2004

(65) Prior Publication Data

US 2005/0253151 A1    Nov. 17, 2005

(30) Foreign Application Priority Data

Aug. 29, 2002  (JP) ............... 2002-249957

(51) Int. Cl.
*H01L 33/00* (2006.01)

(52) U.S. Cl. .......... 257/88; 257/82; 257/164; 257/E51.022; 257/E21.381

(58) Field of Classification Search ......... 257/79, 257/94, 82, 83, 84–85, 88, 12–13, 89, 90, 257/92–95, 96–97, 103, 164, 51.022, 21.381, 257/E51.022, E21.381
See application file for complete search history.

(56) References Cited

U.S. PATENT DOCUMENTS 4,329,625 A    5/1982   Nishizawa et al.
5,986,324 A  * 11/1999  Adlerstein et al. .......... 257/587

(Continued)

FOREIGN PATENT DOCUMENTS

JP        59-206873       11/1984

(Continued)

OTHER PUBLICATIONS esp@cenet database—Worldwide patent abstract, publication No. JP2001156331, published on Jun. 8, 2001 (1 page).

(Continued)

*Primary Examiner*—Hoai v Pham
*Assistant Examiner*—Dilinh Nguyen
(74) *Attorney, Agent, or Firm*—Osha Liang LLP

(57) ABSTRACT

A light-emitting device operating on a high drive voltage and a small drive current. LEDs (1) are two-dimensionally formed on an insulating substrate (10) of e.g., sapphire monolithically and connected in series to form an LED array. Two such LED arrays are connected to electrodes (32) in inverse parallel. Air-bridge wiring (28) is formed between the LEDs (1) and between the LEDs (1) and electrodes (32). The LED arrays are arranged zigzag to form a plurality of LEDs (1) to produce a high drive voltage and a small drive current. Two LED arrays are connected in inverse parallel, and therefore an AC power supply can be used as the power supply.

10 Claims, 20 DrawingSheets

U.S. PATENT DOCUMENTS 6,194,743 B1 * 2/2001 Kondoh et al. ............... 257/94
6,410,942 B1 6/2002 Thibeault et al.

FOREIGN PATENT DOCUMENTS

| JP | 62-273755 | | 11/1987 |
|---|---|---|---|
| JP | 04-023154 | U | 2/1992 |
| JP | 70-86691 | | 3/1995 |
| JP | 10-107316 | A | 4/1998 |
| JP | 10-275935 | A | 10/1998 |
| JP | 11-150303 | A | 6/1999 |
| JP | 2000-68555 | A | 3/2000 |
| JP | 2000-101136 | A | 4/2000 |
| JP | 2001-150718 | | 6/2001 |
| JP | 2001-156331 | A | 6/2001 |
| JP | 2001-307506 | A | 11/2001 |
| JP | 2001-351789 | | 12/2001 |
| JP | 2002-26384 | A | 1/2002 |
| WO | WO-01/47039 | | 6/2001 |

OTHER PUBLICATIONS esp@cenet database—Worldwide patent abstracts, publication No. JP2001307506, published on Nov. 2, 2001 (1 page).
esp@cenet database—Worldwide patent abstracts, publication No. JP2000068555, published on Mar. 3, 2000 (1 page).
esp@cenet database—Worldwide patent abstracts, publication No. JP10107316, published on Apr. 24, 1998 (1 page).
esp@cenet database—Worldwide patent abstracts, publication No. JP10275935, published on Oct. 13, 1998 (1 page).
esp@cenet database—Worldwide patent abstracts, publication No. JP11150303, published on Jun. 2, 1999 (1 page).
esp@cenet database—Worldwide patent abstracts, publication No. JP200010136, published on Apr. 7, 2000 (1 page).
esp@cenet database—Worldwide patent abstracts, publication No. JP2002026384, published on Jan. 25, 2002 (1 page).
Japanese Office Action for Japanese Application No. 2002-249957 dated Apr. 26, 2005, 3 pages.
esp@cenet database—Worldwide Patent Abstract, Publication No. JP2001156331, Publication Date Jun. 8, 2001, 1 page.
esp@cenet database—Worldwide Patent Abstract, Publication No. JP2001307506, Publication Date Nov. 2, 2001, 1 page.
esp@cenet database—Worldwide Patent Abstract, Publication No. JP2000068555, Publication Date Mar. 3, 2001, 1 page.
English language excerpt from Japanese Patent Laid-Open Publication No. 59-206873 published Nov. 22, 1984, 1 page.
"Monolithic Blue LED Series Arrays for High-Voltage AC Operation," written by Jin-Ping Ao et al.; presented at the International Workshop on Nitride Semiconductors (IWN 2002) in Auchen, Germany, Jul. 22-25, 2002.
Office Action dated Feb. 21, 2006 issued in Japanese Patent Application Serial No. 2002-249957, 2 pages (with English translation).
English Patent Abstract of JP2001150718 from esp@cenet, published Jun. 5, 2001, 1 page.
English Patent Abstract of JP7086691 from esp@cenet, published Mar. 31, 1995, 1 page.
English Patent Abstract of JP62273755 from esp@cenet, published Nov. 27, 1987, 1 page.
Office Action dated Apr. 3, 2006 issued in Russian Patent Application 2005103616/28 (094810), 5 pages (with English translation).
Office Action dated Dec. 29, 2006 issued by the China Patent Office in Chinese Patent Application No. 038206226, 12 pages.
Supplementary European Search Report dated Feb. 2, 2007 and issued in Application No. PCT/JP0310922 (3 pages).
English language excerpt from Japanese Patent Publication No. 04-23154 U published Feb. 26, 1992 (2 pages).
English Patent Abstract of JP2001351789 A from esp@cenet, published Dec. 21, 2001 (1 page).
Japanese Notice of Grounds for Rejection with English Translation issued in JP Patent Application No. 2006-117739 (4 pages).
Extended European Search Report issued in EP Patent Application No. 07118916.1 dated Jan. 24, 2008 (5 pages).
Japanese Office Action for Japanese Patent Application No. 2006-117739, mailed Feb. 5, 2008, and English Translation thereof, 4 pages.

* cited by examiner

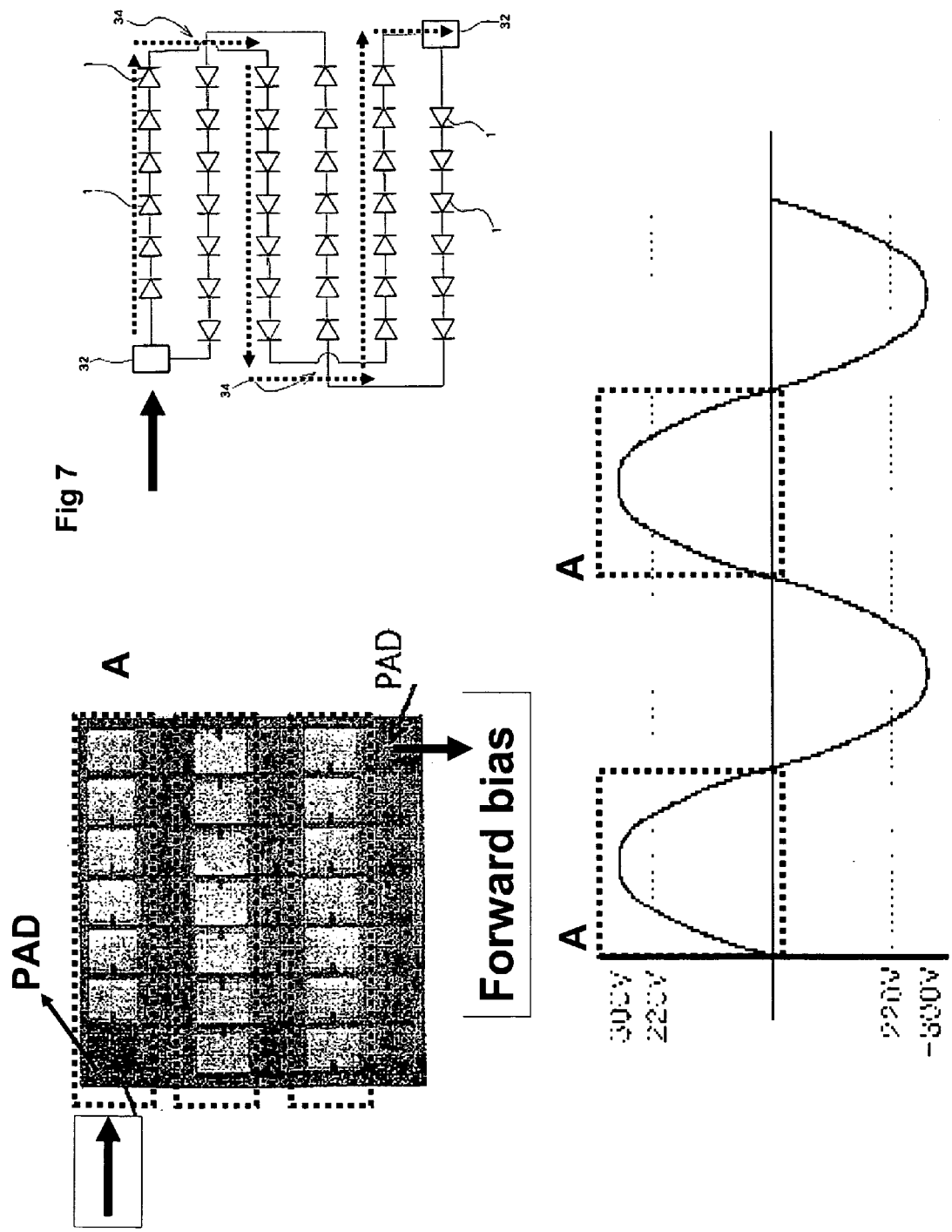

LIGHT-EMITTING DEVICE HAVING LIGHT-EMITTING ELEMENTS

TECHNICAL FIELD

The present invention relates to a light emitting device in which a plurality of light emitting elements are formed on a substrate.

BACKGROUND ART

When light emitting means such as a light emitting element (LED) is used for display or the like, typical usage conditions are approximately 1 V to 4 V for the drive voltage and approximately 20 mA for the drive current. With the recent development of short-wavelength LEDs which uses a GaN-based compound semiconductor and commercialization of solid light sources of full color, white color, etc., application of LEDs for illumination purposes has been considered. When an LED is used for illumination, there may be cases in which the LED is used under conditions other than the above-described conditions of 1 V-4 V of drive voltage and 20 mA of drive current. As a result, steps have been taken to enable a larger current to flow through the LED and to increase the light emission output. In order to flow a larger current, an area of a pn junction of the LED must be increased so that the current density is reduced.

When the LED is used as a light source for illumination, it is convenient to use an AC power supply and allow use with a drive voltage of 100 V or greater. In addition, if the same light emission output is to be obtained with supply of the same power, the power loss can be reduced by applying a high voltage while maintaining a low current value. In the LEDs of the related art, however, it is not always possible to sufficiently increase the drive voltage.

DISCLOSURE OF INVENTION

An object of the present invention is to provide a light emitting device which can be operated with a high drive voltage.

According to one aspect of the present invention, there is provided a light emitting device wherein a plurality of GaN-based light emitting elements are formed on an insulating substrate and the plurality of light emitting elements are monolithically formed and connected in series.

According to another aspect of the present invention, it is preferable that, in the light emitting device, the plurality of light emitting elements are arranged on the substrate in a two-dimensional pattern.

According to another aspect of the present invention, it is preferable that, in the light emitting device, the plurality of light emitting elements are grouped into two groups and the two groups are connected between two electrodes in parallel so that the two groups are of opposite polarities.

According to another aspect of the present invention, it is preferable that, in the light emitting device, the plurality of light emitting elements are connected by air bridge lines.

According to another aspect of the present invention, it is preferable that, in the light emitting device, the plurality of light emitting elements are electrically separated by sapphire which is used as the substrate.

According to another aspect of the present invention, it is preferable that, in the light emitting device, the plurality of light emitting elements are grouped into two groups having equal numbers of light emitting elements, an array of light emitting elements in each group are arranged in a zigzag pattern, and the two groups of light emitting element arrays are connected between two electrodes in parallel so that they are of opposite polarities. According to another aspect of the present invention, it is preferable that, in the light emitting device, the two groups of light emitting element arrays are arranged alternately.

According to another aspect of the present invention, it is preferable that, in the light emitting device, the light emitting element and the electrode have a planar shape of approximate square or triangle.

According to another aspect of the present invention, it is preferable that, in the light emitting device, the overall shape of the plurality of light emitting elements and the electrode is approximate square.

According to another aspect of the present invention, it is preferable that, in the light emitting device, the electrode is an electrode for an alternate current power supply.

According to another aspect of the present invention, it is preferable that, in the light emitting device, the two groups of light emitting element arrays have a common n electrode.

In the present invention, a plurality of light emitting elements are monolithically formed, that is, formed on a same substrate, and are connected in series. With this structure, the present invention allows a high drive voltage. By connecting a plurality of light emitting elements along one direction, a DC drive is possible. By grouping the plurality of light emitting elements into two groups and connecting the two groups between electrodes such that the two groups of light emitting elements (light emitting element arrays) are of opposite polarities from each other, it is possible to also allow an AC drive. The numbers of elements in the groups may be the same or different.

Various methods are available for two-dimensionally placing or arranging a plurality of light emitting elements, and a method which minimizes an area occupied on the substrate is desirable. For example, by arranging the two groups of light emitting element arrays in zigzag pattern, that is, arranging a plurality of light emitting elements on a bent line and alternately arranging the light emitting element arrays, the substrate area can be efficiently utilized and a large number of light emitting elements can be connected. When the two light emitting element arrays are alternately positioned, a crossing portion of lines may occur. It is possible to effectively prevent short-circuiting at the crossing portion by connecting the light emitting elements by air bridge lines. The shapes of the light emitting elements and the electrodes is not limited. By forming the light emitting elements and the electrodes to have a planar shape of, for example, approximate square, the overall shape becomes an approximate square, which allows for the use of a standard mounting structure. It is also possible to employ a shape other than the square, for example, a triangle, for the light emitting elements and the electrodes, to form an approximate square shape as an overall shape by combining the triangles, and, as a consequence, it is possible to use a standard mounting structure in a similar manner.

BEST MODE FOR CARRYING OUT THE INVENTION

Figure 1:
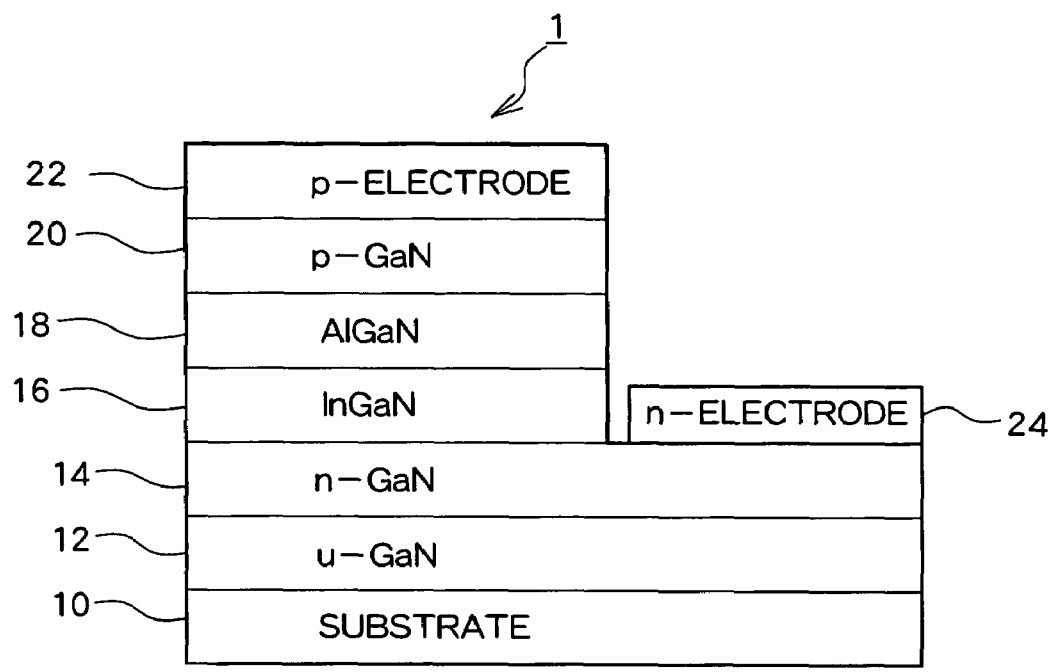
FIG. 1 is a diagram showing a basic structure of a light emitting element (LED).

A preferred embodiment of the present invention will now be described referring to the drawings.

FIG. 1 shows a basic structure of an LED 1 which is a GaN-based compound semiconductor light emitting element of the present embodiment. The LED 1 has a structure in which a GaN layer 12, an Si-doped n-type GaN layer 14, an InGaN light emitting layer 16, an AlGaN layer 18, and a p-type GaN layer 20 are sequentially layered on a substrate 10, a p electrode 22 is formed in contact with the p-type GaN layer 20, and an n electrode 24 is formed in contact with the n-type GaN layer 14.

The LED shown in FIG. 1 is manufactured through the following process. First, a sapphire c-plane substrate is thermally treated for 10 minutes in a hydrogen atmosphere at a temperature of 1100° C. in an MOCVD device. Then, the temperature is reduced to 500° C. and silane gas and ammonia gas are supplied for 100 seconds to form a discontinuous SiN film on the substrate 10. This process is applied in order to reduce a dislocation density within the device and the SiN film is not shown in FIG. 1. Next, trimethyl gallium and ammonia gas are supplied at the same temperature to grow a GaN layer to a thickness of 20 nm. The temperature is raised to 1050° C. and trimethyl gallium and ammonia gas are supplied again to grow an undoped GaN (u-GaN) layer 12 and an Si-doped n-type GaN layer 14 to a thickness of 2 μm each. Then, the temperature is reduced to approximately 700° C. and an InGaN light emitting layer 16 is grown to a thickness of 2 nm. A target composition is x=0.15, that is, $In_{0.15}Ga_{0.85}N$. After the light emitting layer 16 is grown, the temperature is raised to 1000° C., an AlGaN hole injection layer 18 is grown, and a p-type GaN layer 20 is grown.

After the p-type GaN layer 20 is grown, the wafer is taken out of the MOCVD device and a Ni layer of 10 nm and a Au layer of 10 nm are sequentially vacuum-evaporated to form these layers on the surface of the grown layer. A thermal treatment is applied in a nitrogen gas atmosphere containing 5% oxygen at a temperature of 520° C. so that the metal film becomes a p-type transparent electrode 22. After the transparent electrode is formed, a photoresist is applied over the entire surface and an etching process is applied for forming an n-type electrode using the photoresist as a mask. The depth of etching is, for example, approximately 600 nm. A Ti layer of 5 nm thickness and an Al layer of 5 nm thickness are formed above the n-type GaN layer 14 exposed by the etching process and a thermal treatment is applied in a nitrogen gas atmosphere at a temperature of 450° C. for 30 minutes to form an n-type electrode 24. Finally, a rearside of the substrate 10 is ground to a thickness of 100 μm and chips are cut away and mounted to obtain the LED 1.

In FIG. 1, one GaN-based LED 1 is formed on a substrate 1, but in the present embodiment, a plurality of LEDs 1 are monolithically formed on the substrate 10 in a two-dimensional array and the LEDs are connected to form the light emitting device (chip). Here, "monolithic" indicates that all elements are formed on one single substrate.

Figure 2:
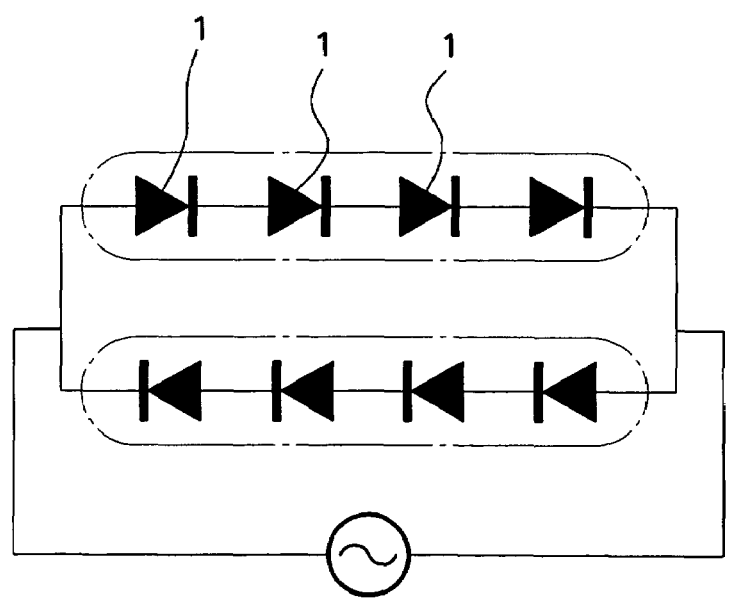
FIG. 2 is an equivalent circuit diagram of a light emitting device.

FIG. 2 is a diagram showing an equivalent circuit of the light emitting device. In FIG. 2, the light emitting elements formed in the two-dimensional array are grouped into two groups of same number of light emitting elements (in FIG. 2, 4 light emitting elements). The LEDs 1 in each group are connected in series and the two groups of LED arrays are connected in parallel between electrodes (drive electrodes) such that the two groups are of opposite polarities. In this manner, by connecting the array of LEDs in series, it is possible to drive the LEDs 1 at a high voltage in which the drive voltage of each LED is added. Because the LED arrays are connected in parallel between the electrodes such that the LED arrays are of opposite polarities, even when an AC power supply is used as a power supply, one of the LED array always emits light in each period of the power supply, which allows an effective light emission.

Figure 3:
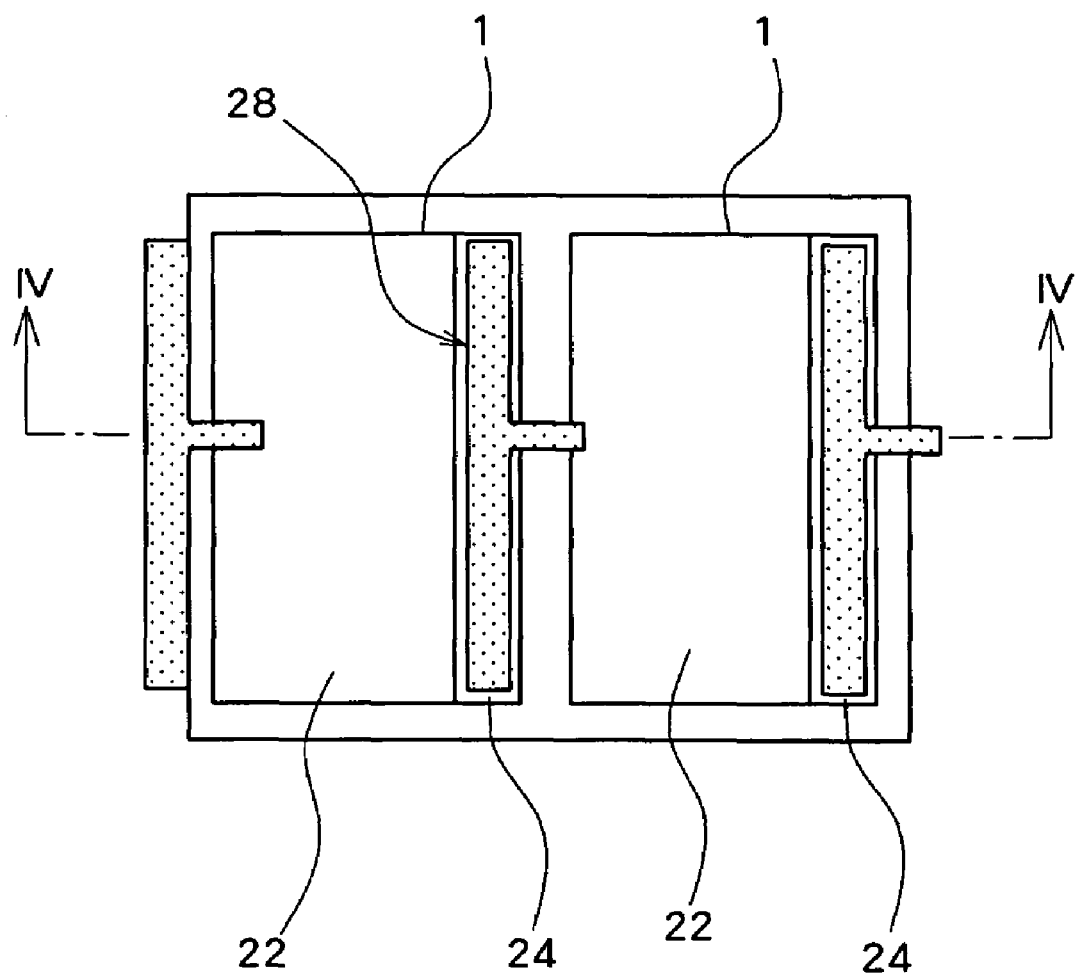
FIG. 3 is a plan view of two LEDs.
Figure 4:
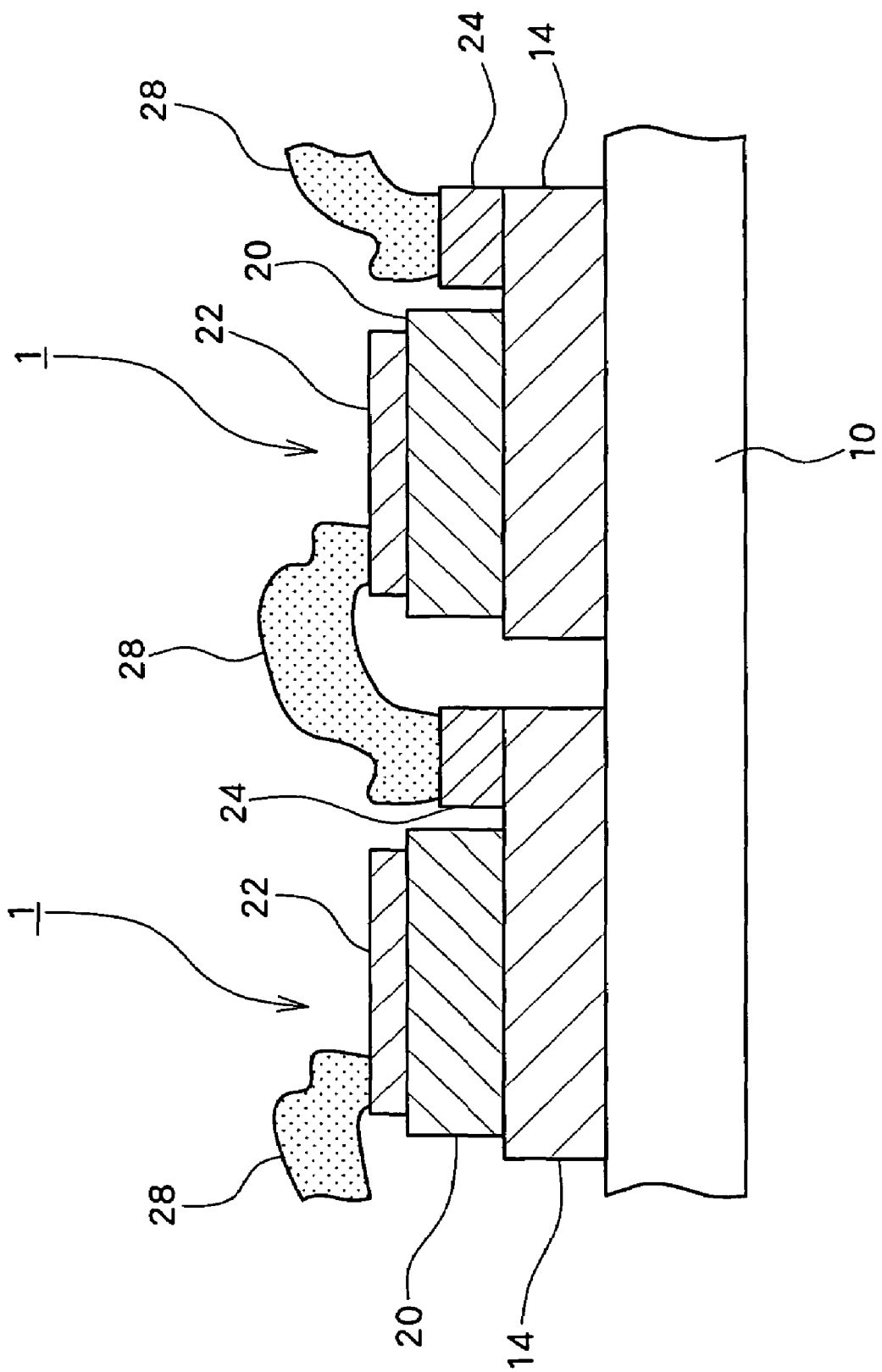
FIG. 4 is a crosssectional view along a IV-IV line of FIG. 3.

FIG. 3 is a partial plan view of a plurality of LEDs monolithically formed on the substrate 10. FIG. 4 is a diagram showing a IV-IV cross section of FIG. 3. In FIG. 3, a p electrode 22 and an n electrode 24 are formed on the upper surface of the LED 1 as shown in FIG. 1. The p electrode 22 and the n electrode 24 of adjacent LEDs 1 are connected through an air bridge line 28 and a plurality of LEDs 1 are connected in series.

In FIG. 4, the LEDs 1 are shown in a simple manner for explanation purposes. Specifically, only the n-GaN layer 14, the p-GaN layer 20, the p-electrode 22, and the n-electrode 24 are shown. In real applications, the InGaN light emitting layer 16 is also present as shown in FIG. 1. The air bridge line 28 connects from the p electrode 22 to the n electrode 24 through the air. In this manner, in contrast to a method of applying an insulating film on a surface of the element, forming electrodes on the insulating film, and electrically connecting the p electrode 22 and the n electrode 24, it is possible to avoid the problem of degradation of the LEDs 1 as a result of thermal diffusion of elements forming the insulating material to the n layer and p layer from a line disconnection or insulating film, because it is no longer necessary to place the electrodes along the etching groove. The air bridge line 28 is also used for connecting between the LED 1 and the electrode which is not shown in FIG. 4, in addition to the connection between the LEDs 1.

In addition, as shown in FIG. 4, the LEDs 1 must be independent and electrically insulated from each other. For this purpose, the LEDs 1 are separated on the sapphire substrate 10. Because sapphire is an insulating material, it is possible to electrically separate the LEDs 1. By using the sapphire substrate 10 as a resistive body for achieving an electrical separation between the LEDs, it is possible to electrically separate the LEDs in an easy and reliable manner.

As the light emitting element, it is also possible to employ an MIS in place of the LED having a pn junction.

Figure 5:
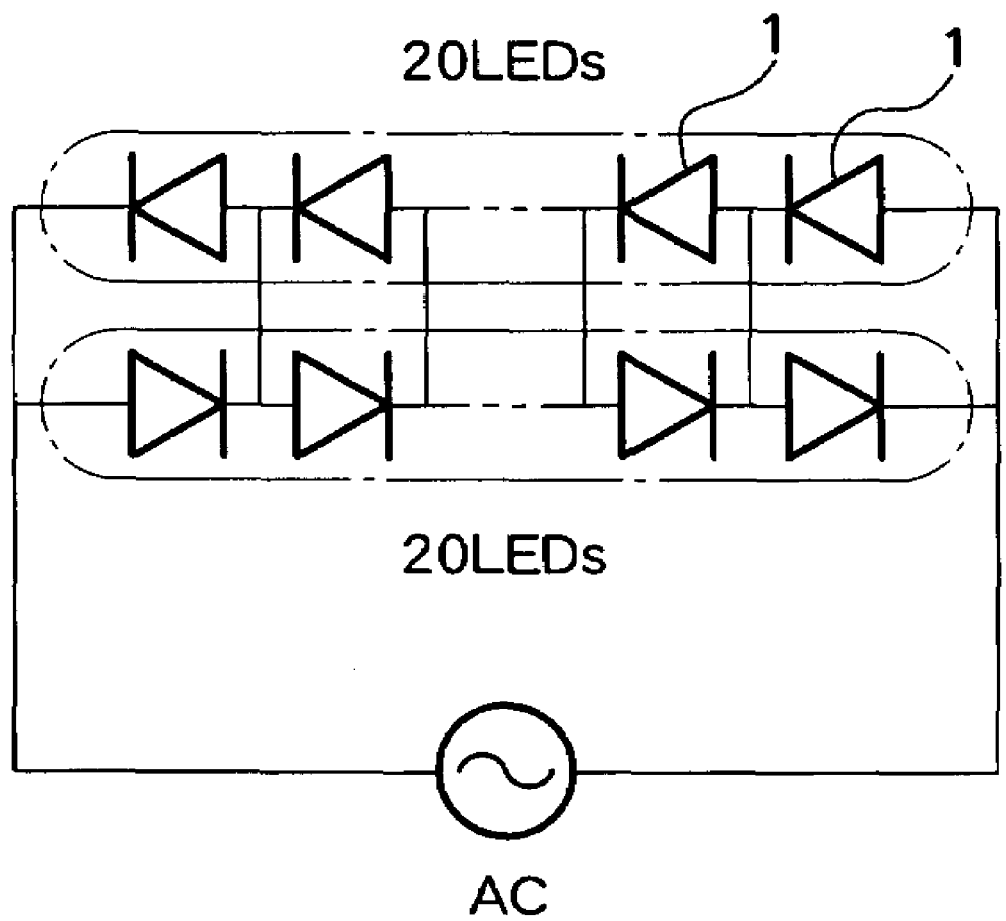
FIG. 5 is another equivalent circuit diagram of a light emitting device.

FIG. 5 is a diagram showing another equivalent circuit of the light emitting device. In FIG. 5, 20 LEDs 1 are connected in series to form one LED array and two such LED arrays (a total of 40 LEDs) are connected to a power supply in parallel. The drive voltage of the LED 1 is set to 5 V, and thus, the drive voltage of each LED array is 100 V. The two LED arrays are connected in parallel to the power supply such that the LED arrays are of opposite polarities, similar to FIG. 2. Light is always emitted from one of the LED arrays, regardless of the polarity of the power supply.

Figure 6:
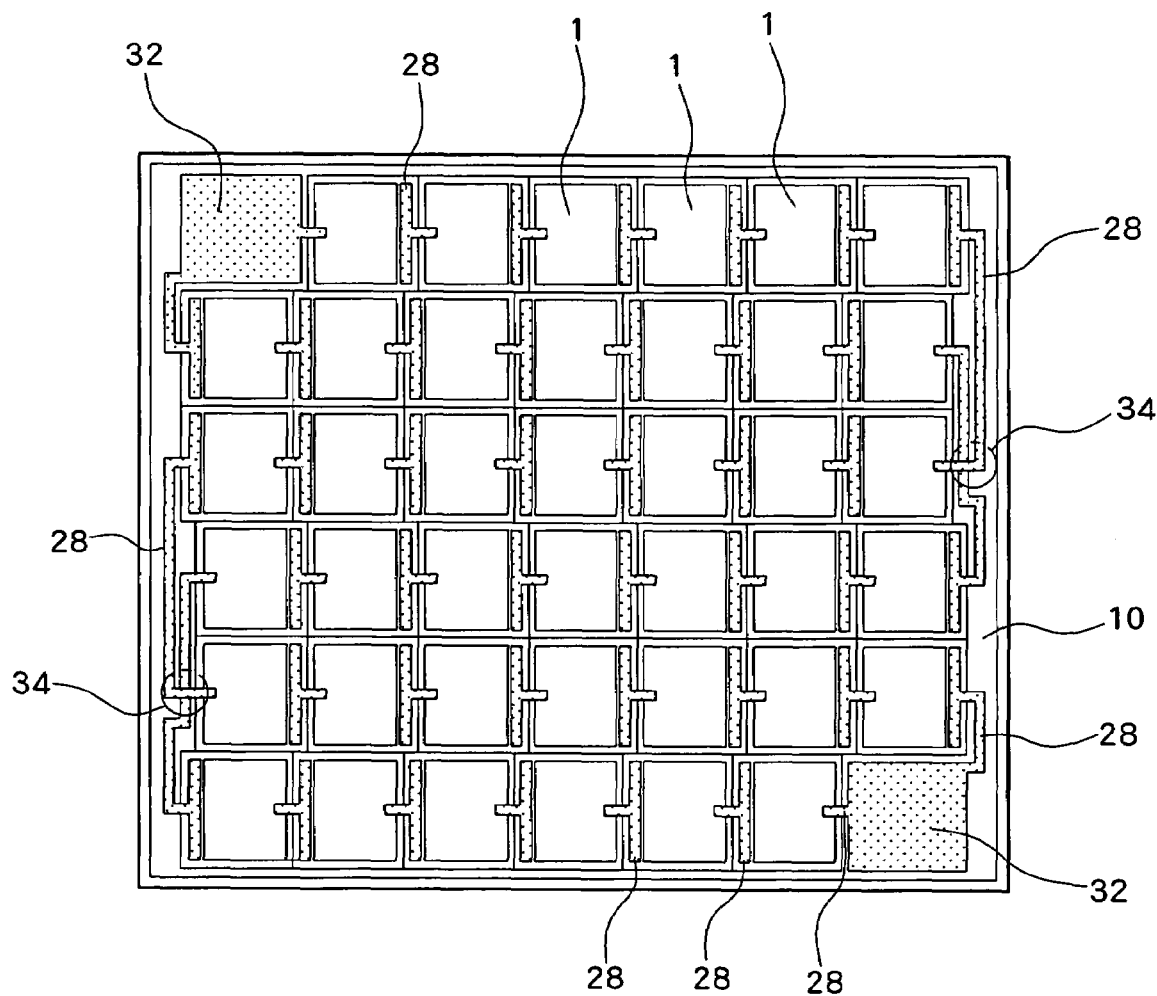
FIG. 6 is an explanatory diagram of a structure in which 40 LEDs are arranged in a two-dimensional pattern.

FIG. 6 shows a specific structure of the two-dimensional array and corresponds to the equivalent circuit diagram of FIG. 2. In FIG. 6, a total of 40 LEDs 1 are formed on the sapphire substrate 10 which are grouped into two groups of 20 LEDs 1. The groups of LEDs 1 are connected in series by the air bridges 28 to form two LED arrays. More specifically, all of the LEDs 1 has a square shape of the same size and same shape. A first LED array comprises, from the top line toward the bottom line, a line of 6 LEDs are arranged in a straight line, a line of 7 LEDs are arranged in a straight line, and a line of 7 LEDs are arranged in a straight line. The first row (6 LEDs) and the second row (7 LEDs) are formed facing opposite directions and the second row and the third row are formed facing opposite directions. The first row and the second row are separated from each other and the second row and the third row are separated from each other, because rows of the other LED array are alternately inserted, as will be described later. The rightmost LED 1 of the first row and the rightmost LED 1 of the second row are connected by an air bridge line 28 and the leftmost LED 1 of the second row and the leftmost LED 1 of the third row are connected by an air bridge line 28 to construct a zigzag arrangement. The leftmost LED 1 of the first row is connected to an electrode (pad) 32 formed on an upper left section of the substrate 10 by an air bridge line 28 and the rightmost LED 1 of the third row is connected to an electrode (pad) 32 formed on a lower right section of the substrate 10 by an air bridge line 28. The two electrodes (pads) 32 have the same square shape as the LEDs 1. The second LED array is alternately formed in the spaces of the first LED array. More specifically, in the second LED array, 7 LEDs, 7 LEDs, and 6 LEDs are formed on straight lines from the top to the bottom, the first row is formed between the first row and the second row of the first LED array, the second row is formed between the second row and the third row of the first LED array, and the third row is formed below the third row of the first LED array. The first row and the second row of the second LED array are formed facing opposite directions and the second row and the third row of the second LED array are formed facing opposite directions. The rightmost LED 1 of the first row is connected to the rightmost LED 1 of the second row by an air bridge line 28 and the leftmost LED 1 of the second row is connected to the leftmost LED 1 of the third row by an air bridge line 28 to construct a zigzag arrangement. The leftmost LED of the first row of the second LED array is connected to the electrode 32 formed on the upper left section of the substrate 10 by an air bridge line 28 and the rightmost LED 1 of the third row is connected to the electrode 32 formed on the lower right section of the substrate 10 by an air bridge line 28. Polarities of the LED arrays with respect to the electrodes 32 are opposite from each other. The overall shape of the light emitting device (chip) is rectangular. It should also be noted that two electrodes 32 to which a power supply is supplied are formed in diagonally opposite positions of the rectangle and are spaced apart.

Figure 7:
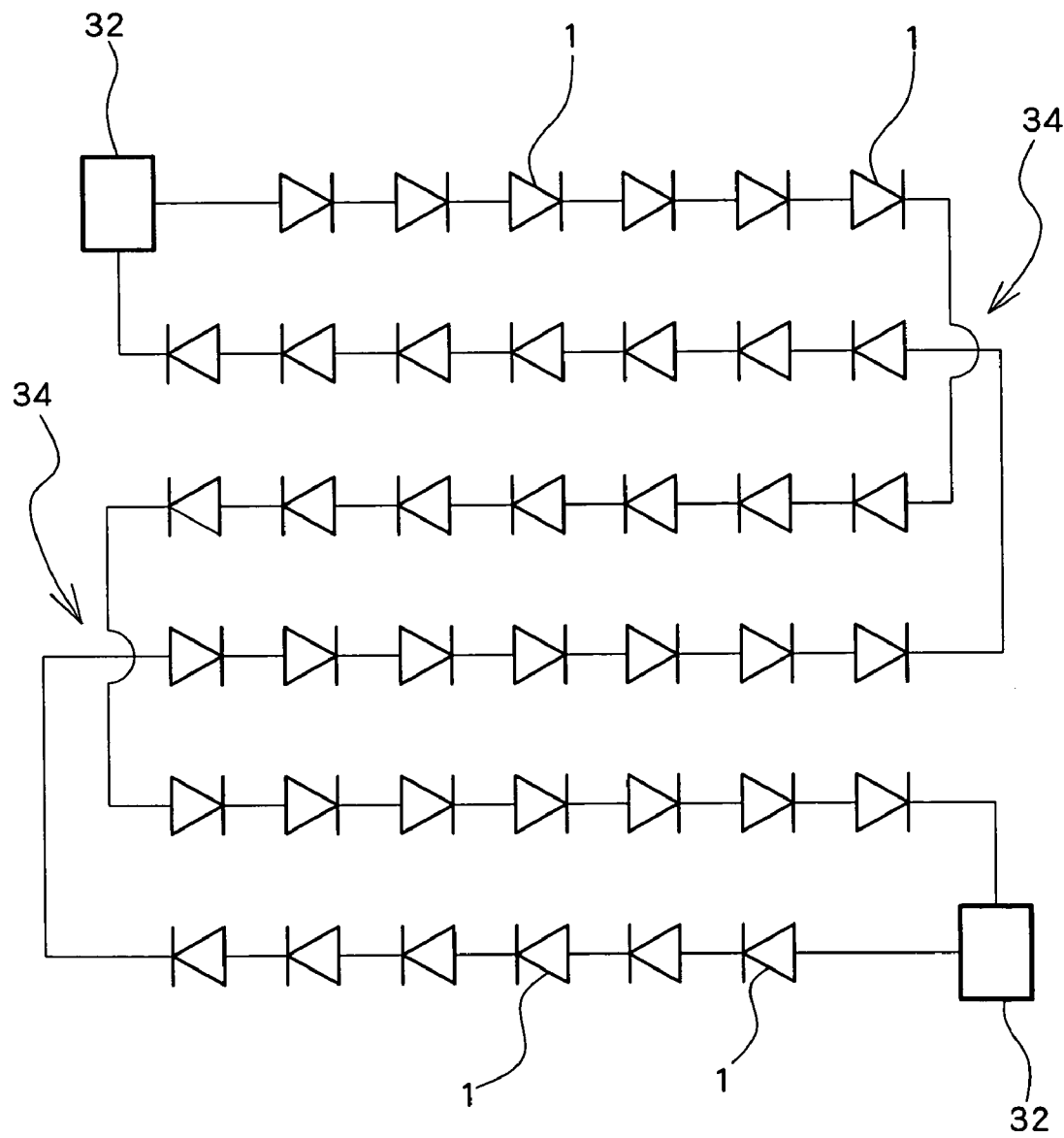
FIG. 7 is a circuit diagram of the structure shown in FIG. 6.

FIG. 7 is a circuit diagram of the circuit shown in FIG. 6. It can be seen from this figure that each LED array is connected in series while bending in a zigzag pattern and two LED arrays have the zigzag shaped rows formed between the rows of the other LED array. By employing such a configuration, many LEDs 1 can be arranged on a small substrate 10. In addition, because only two electrodes 32 are required for 40 LEDs 1, the usage efficiency on the substrate 10 can be further improved. Moreover, when the LEDs 1 are individually formed in order to separate LEDs 1, the wafer must be cut for separation, but, in the present embodiment, the separation between LEDs 1 can be achieved through etching, which allows for narrowing of a gap between the LEDs 1. With this configuration, it is possible to further reduce the size of the sapphire substrate 10. The separation between LEDs 1 is achieved by etching and removing regions other than the LEDs 1 to the point which reaches the substrate 10 by using photoresist, reactive ion etching, and wet etching. Because the LED arrays alternately emit light, the light emission efficiency can be improved and heat discharging characteristic can also be improved. Moreover, by changing the number of LEDs 1 to be connected in series, the over all drive voltage can also be changed. In addition, by reducing the area of the LED 1, it is possible to increase the drive voltage per LED. When 20 LEDs 1 are serially connected and are driven with a commercially available power supply (100 V, 60 Hz), a light emission power of approximately 150 mW can be obtained. The drive current in this case is approximately 20 mA.

As is clear from FIG. 7, when two LED arrays are alternately arranged in a zigzag pattern, a crossing section 34 inevitably occurs in the air bridge line 28. For example, when the first row and the second row of the second LED array are connected, this portion crosses the line portion for connecting the first row and the second row of the first LED array. However, the air bridge line 28 of the present embodiment is not adhered to the substrate 10 as described above and extends through the air, distanced from the substrate 10. Because of this structure, short-circuiting due to contact of the air bridge lines 28 at the crossing section can be easily avoided. This is one advantage of using the air bridge line 28. The air bridge line 28 is formed, for example, through the following processes. A photoresist is applied over the entire surface to a thickness of 2 μm and a post bake process is applied after a hole is opened in a shape of the air bridge line. Over this structure, a Ti layer of 10 nm and a Au layer of 10 nm are evaporated in this order through vacuum evaporation. A photoresist is again applied over the entire surface to a thickness of 2 μm and holes are opened in portions in which the air bridge lines are to be formed. Then, using Ti and Au as electrodes, Au is deposited over the entire surface of the electrodes to a thickness of 3-5 μm through ion plating (plating) in an electrolyte. Then, the sample is immersed in acetone, the photoresist is dissolved and removed through ultrasonic cleaning, and the air bridge line 28 is completed.

In this manner, by placing the plurality of LEDs 1 in a two-dimensional array shape, it is possible to effectively use the substrate area and to allow a high drive voltage, in particular, driving using the commercially available power supply. Various other patterns can be employed as the pattern of the two-dimensional array. In general, the two-dimensional array pattern preferably satisfies the following conditions:
(1) the shape of the LED and electrode positions are preferably identical in order to allow uniform current to flow through the LEDs and to obtain uniform light emission;
(2) the sides of the LEDs are preferably straight lines in order to allow cutting of wafer to create chips;
(3) the LED preferably has a planar shape similar to square in order to use a standard mount and utilize reflection from periphery to improve the light extraction efficiency;
(4) a size of two electrodes (bonding pads) is preferably approximately 100 μm square and the two electrodes are preferably separated from each other; and
(5) the ratio of the line and pad is preferably minimum in order to effectively use the wafer area.

These conditions are not mandatory, and it is possible, for example, to employ a planar shape of triangle as the shape of the LED. Even when the shape of the LED is a triangle, the overall shape of approximate square can be obtained by combining the triangles. Some examples of two-dimensional array patterns will now be described.

Figure 8:
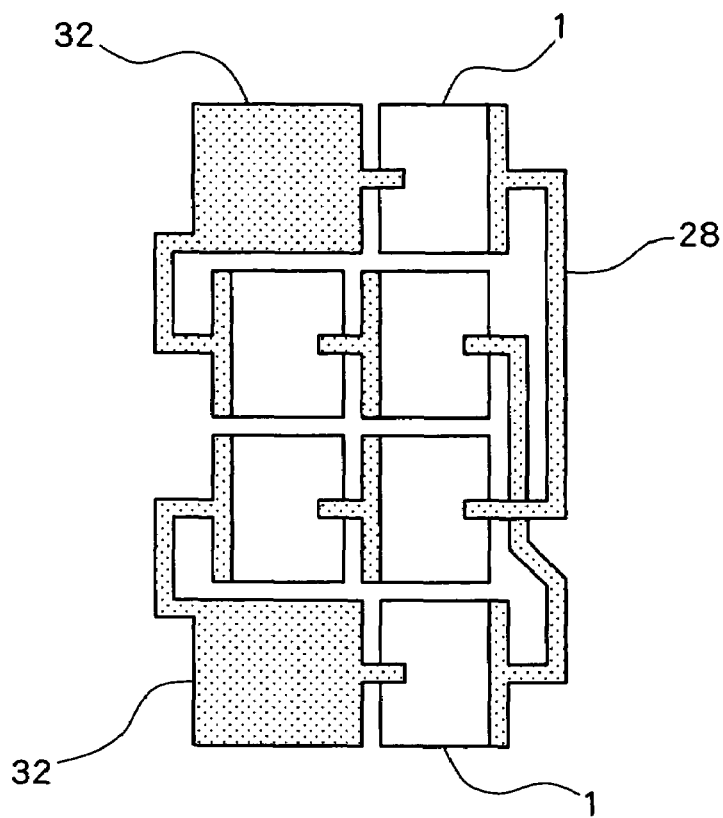
FIG. 8 is an explanatory diagram of a structure in which 6 LEDs are arranged in a two-dimensional pattern.
Figure 9:
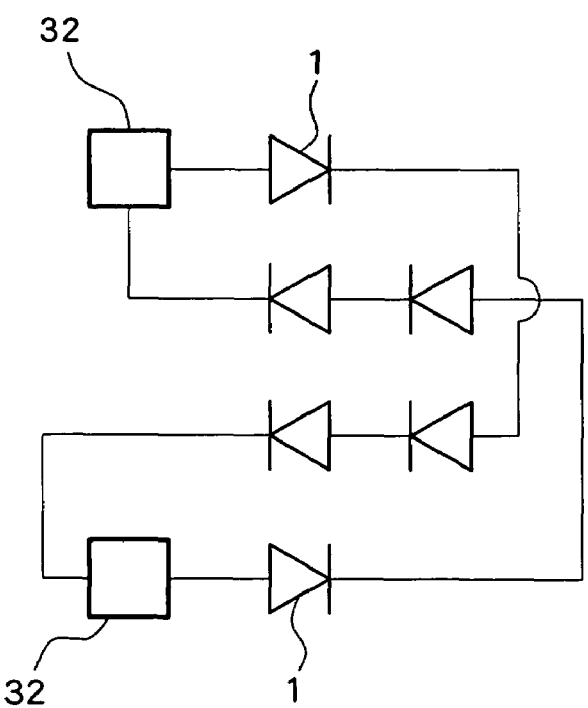
FIG. 9 is a circuit diagram of the structure shown in FIG. 8.

FIG. 8 shows a two-dimensional arrangement of a total of 6 LEDs 1 and FIG. 9 shows a circuit diagram of this configuration. The arrangement of FIG. 8 is basically identical to that of FIG. 6. 6 LEDs are grouped into two groups of the same number to form LED arrays having 3 LEDs connected in series. The first LED array is arranged in a zigzag pattern with the first row having one LED and the second row having two LEDs. The LED of the first row and the rightmost LED 1 of the second row are connected in series by an air bridge line 28 and the two LEDs 1 of the second row are connected in series by an air bridge line 28. Electrodes (pads) 32 are formed at an upper left section and a lower left section of the substrate 10. The LED 1 of the first row is connected to the electrode 32 at the upper left section by an air bridge line and the leftmost LED 1 of the second row is connected to the electrode 32 at the lower left section. The second LED array is also arranged in a zigzag pattern and has two LEDs 1 on the first row and one LED 1 on the second row. The first row of the second LED array is formed between the first row and the second row of the first LED array and the second row of the second LED array is formed below the second row of the first LED array. The rightmost LED 1 of the first row is connected in series to the LED 1 of the second row by an air bridge line 28 and the two LEDs 1 on the first row are connected in series by an air bridge line 28. The leftmost LED 1 of the first row is connected to the electrode 32 at the upper left section by an air bridge line 28 and the LED 1 of the second row is connected to the electrode 32 at the lower left section by an air bridge line 28. As can be seen from FIG. 9, in this configuration also, two LED arrays are connected between the electrodes 32 in parallel such that they are of opposite polarities. Therefore, when an AC power supply is supplied, the two LED arrays alternately emit light.

Figure 10:
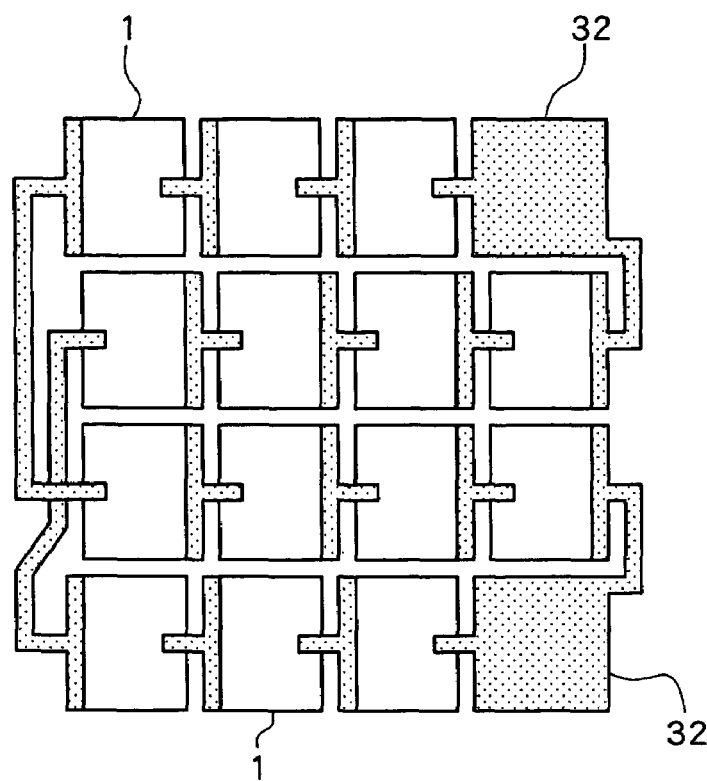
FIG. 10 is an explanatory diagram of a structure in which 14 LEDs are arranged in a two-dimensional pattern.
Figure 11:
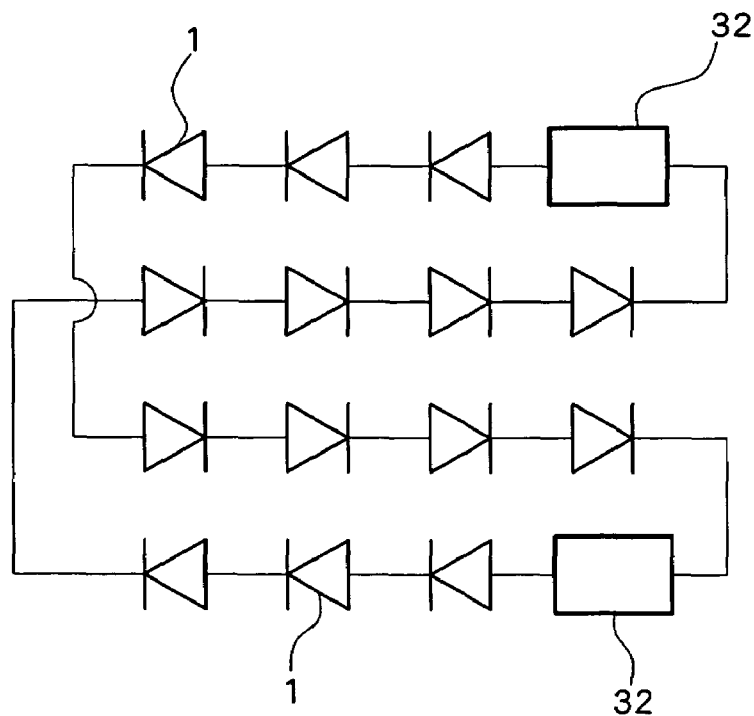
FIG. 11 is a circuit diagram of the structure shown in FIG. 10.

FIG. 10 shows a configuration in which a total of 14 LEDs are arranged in a two-dimensional pattern and FIG. 11 shows a circuit diagram of this configuration. 14 LEDs are grouped into two groups and the LED array has 7 LEDs connected in series. A first LED array is arranged in a zigzag pattern with the first row having 3 LEDs 1 and the second row having 4 LEDs 1. The leftmost LED of the first row and the leftmost LED 1 of the second row are connected in series by an air bridge line 28, 3 LEDs of the first row are connected in series by air bridge lines 28, and 4 LEDs 1 of the second row are connected in series by air bridge lines 28. Electrodes (pads) 32 are formed at an upper right section and a lower right section of the substrate 10, the rightmost LED 1 of the first row is connected to the electrode 32 at the upper right section by an air bridge line and the rightmost LED 1 of the second row is connected to the electrode 32 at the lower right section. A second LED array also is arranged in a zigzag pattern with a first row having 4 LEDs 1 and a second row having 3 LEDs 1. The first row of the second LED array is formed between the first row and the second row of the first LED array and the second row of the second LED array is formed below the second row of the first LED array. The leftmost LED 1 of the first row is connected in series to the leftmost LED 1 of the second row by an air bridge line 28. 4 LEDs 1 on the first row are connected in series and 3 LEDs 1 on the second row are connected in series. The rightmost LED 1 on the first row is connected to the electrode 32 on the upper right section by an air bridge line 28 and the rightmost LED 1 on the second row is connected to the electrode 32 at the lower right section by an air bridge line 28. As can be seen from FIG. 11, in this configuration also, the two LED arrays are connected between the electrodes 32 in parallel such that they are of opposite polarities. Therefore, when an AC-power supply is supplied, the two LED arrays alternately emit light.

Characteristics common to the two-dimensional patterns of FIGS. 6, 8, and 10 are that the LEDs 1 have the same shape of approximate square and same size, the two electrodes (pads) also have approximate square shape and are not formed adjacent to each other (are formed separate from each other), the configuration is a combination of two LED arrays, the two LED arrays are bent and cross each other on the chip, the two LED arrays are connected between electrodes such that they are of opposite polarities, etc.

Figure 12:
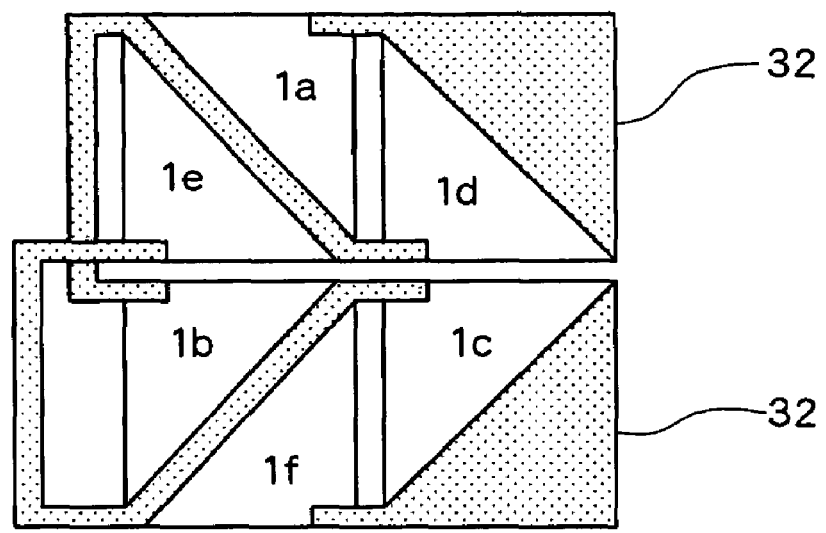
FIG. 12 is an explanatory diagram of a structure in which 6 LEDs are arranged in a two-dimensional pattern.
Figure 13:
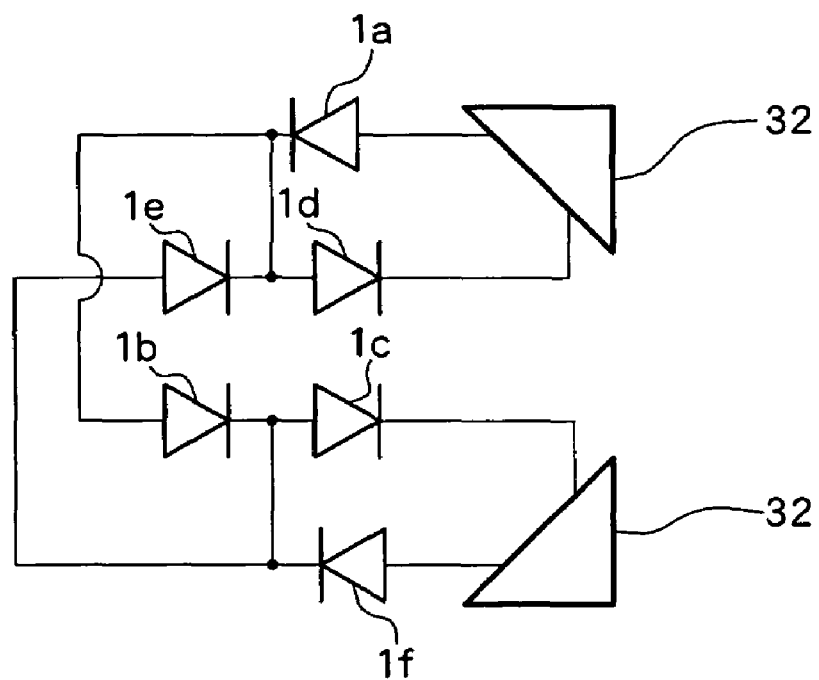
FIG. 13 is a circuit diagram of the structure shown in FIG. 12.

FIG. 12 shows a configuration in which LEDs having a planar shape of triangle are arranged in a two-dimensional pattern and FIG. 13 shows a circuit diagram of this configuration. In FIG. 12, a total of 6 LEDs, LEDs 1a, 1b, 1c, 1d, 1e, and 1f are formed such that they have a planar shape of a triangle. LEDs 1a and 1e are arranged opposing each other at one side of the triangle so that the two LEDs form an approximate square and LEDs 1b and 1f are placed opposing each other, so that the two LEDs form an approximate square. The LED 1d and an electrode 32 oppose and are connected to each other and the LED 1c and an electrode 32 oppose and are connected to each other. Similar to the LEDs, the two electrodes 32 also have a planar shape of a triangle and are placed to form an approximate square. The opposing sides of the LEDs form an n electrode 24, that is, two opposing LEDs share the n electrode 24. Similarly, the LED and the electrode 32 are connected through the n electrode. In this arrangement also, the 6 LEDs are grouped into two groups similar to the above-described arrangements. A first LED array includes the LEDs 1a, 1b, and 1c. A p electrode 22 of the LED 1a is connected to the electrode 32 by an air bridge line 28 and an n electrode 24 of the LED 1a is connected to a p electrode 22 of the LED 1b by an air bridge line 28. An n electrode 24 of the LED 1b is connected to a p electrode 22 of the LED 1c by an air bridge line 28. An n electrode 24 of the LED 1c is connected to the electrode 32. A second LED array includes LEDs 1d, 1e, and 1f. The electrode 32 is connected to a p electrode 22 of the LED 1f by an air bridge line 28, an n electrode 24 of the LED 1f is connected to a p electrode 22 of the LED 1e by an air bridge line 28, an n electrode 24 of the LED 1e is connected to a p electrode 22 of the LED 1d by an air bridge line 28, and an n electrode 24 of the LED 1d is connected to the electrode 32.

In FIG. 13, it should also be noted that the n electrode of the LED 1a which is a part of the first LED array is connected to the n electrode of the LED 1e which is a part of the second LED array and the n electrode of the LED 1b which is a part of the first LED array is connected to the n electrode of the LED 1f which is a part of the second LED array. By sharing some of the n electrodes in the two LED arrays, it is possible to reduce the amount of circuit wiring. In addition, in this configuration also, the two LED arrays are connected between the electrodes 32 in parallel such that they are of opposite polarities. The LEDs have the same shape and the same size, and by placing the LEDs to oppose at one side and forming the electrode 32 in a triangular shape, it is possible to densely form the LEDs and electrodes to reduce the necessary area of the substrate.

Figure 14:
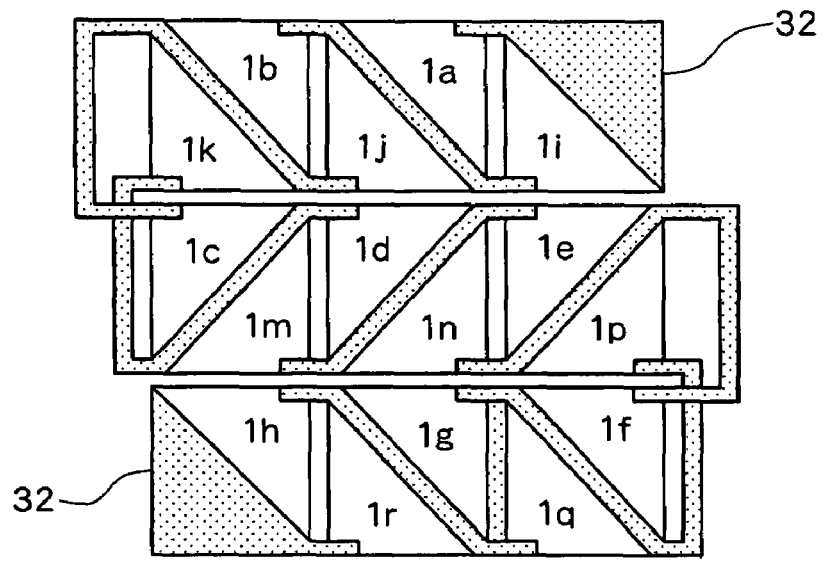
FIG. 14 is an explanatory diagram of a structure in which 16 LEDs are arranged in a two-dimensional pattern.
Figure 15:
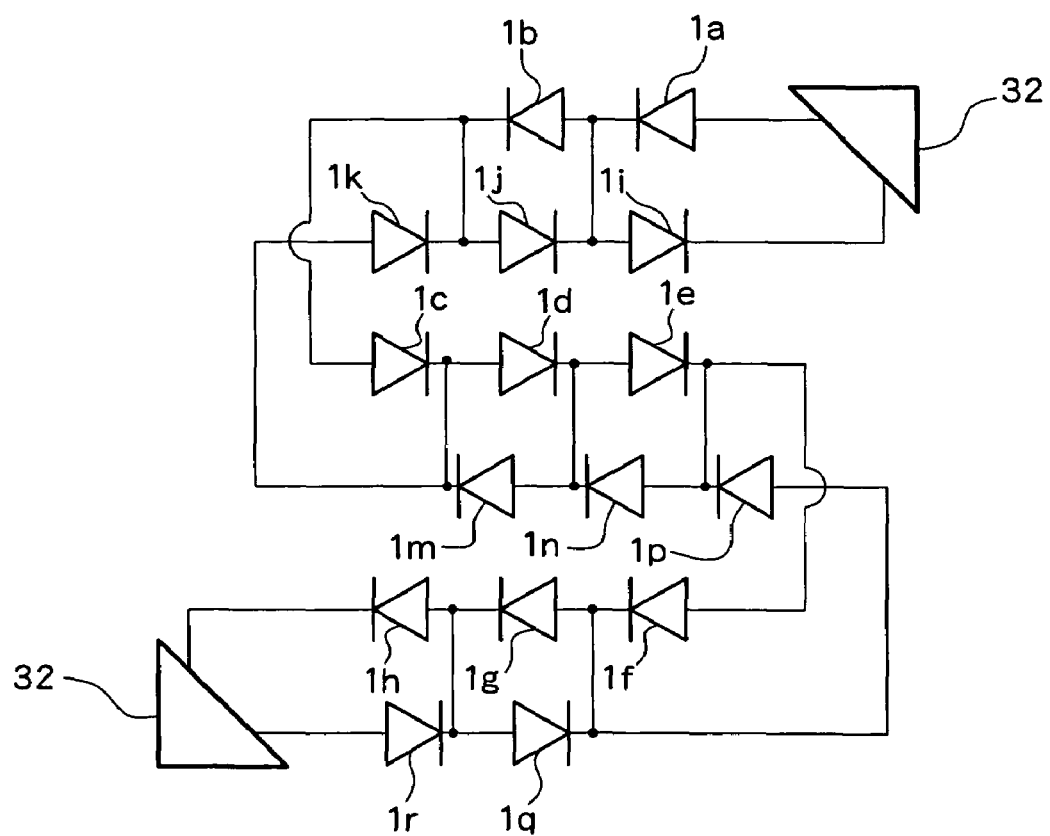
FIG. 15 is a circuit diagram of the structure shown in FIG. 14.

FIG. 14 shows another configuration in which LEDs having a planar shape of a triangle are arranged in a two-dimensional pattern and FIG. 15 shows a circuit diagram of this configuration. In this configuration, a total of 16 LEDs, LEDs 1a-1r are two-dimensionally formed. LEDs 1a and 1j, LEDs 1b and 1k, LEDs 1c and 1m, LEDs 1d and 1n, LEDs 1e and 1p, LEDs 1f and 1q, and LEDs 1g and 1r oppose each other at one side of the triangle. An n electrode 24 is formed common to the LEDs at the opposing side. The LED 1i and an electrode 32 oppose each other and the LED 1h and an electrode 32 oppose each other. A first LED array includes the LEDs 1a, 1b, 1c, 1d, 1e, 1f, 1g, and 1h and a second LED array includes the LEDs 1r, 1q, 1p, 1n, 1m, 1k, 1j, and 1i. An n electrode 24 of the LED 1b is connected to a p electrode 22 of the LED 1c by an air bridge line 28 and an n electrode 24 of the LED 1e is connected to a p electrode 22 of the LED 1f by an air bridge line 28. An n electrode 24 of the LED 1q is connected to a p electrode 22 of the LED 1p by an air bridge line 28 and an n electrode of the LED 1m is connected to a p electrode 22 of the LED 1k by an air bridge line 28. In FIG. 14 also, a crossing portion occurs similar to FIG. 12, but short-circuiting can be avoided by the air bridge lines 28. In this configuration also, some of the n electrodes 24 in the two LED arrays are formed as common structures in order to reduce the amount of necessary wirings. Moreover, in this configuration also, the two LED arrays are connected between the electrodes 32 in parallel so that they are of opposite polarities and the device can be AC driven. FIG. 12 shows a case of 6 LEDs and FIG. 14 shows a case of 16 LEDs. Similar two-dimensional arrangements can be achieved also with different numbers of LEDs. The present inventors have created a light emitting device in which 38 LEDs are arranged in a two-dimensional pattern.

Cases of AC drive have been described, but the structure can also be DC driven. In this case, the LED arrays are not connected between the electrodes to have opposite polarities, but rather, the LED array is connected in a forward direction along the direction of polarity of the DC power supply. By connecting a plurality of LEDs in series, it is possible to achieve a high voltage drive. Configurations for DC drive will now described.

Figure 16:
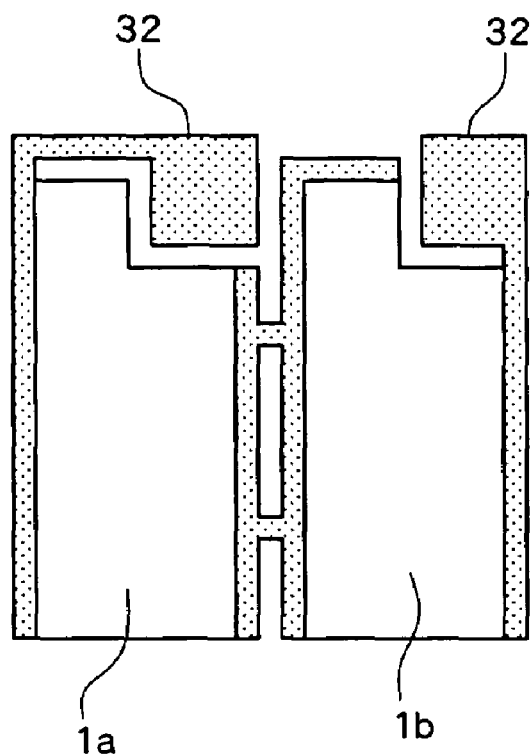
FIG. 16 is an explanatory diagram of a structure comprising 2 LEDs.
Figure 17:
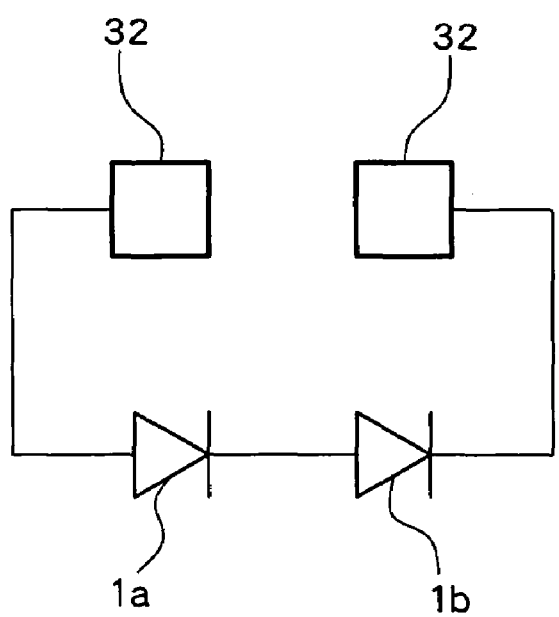
FIG. 17 is a circuit diagram of the structure shown in FIG. 16.

FIG. 16 shows a configuration in which two LEDs are connected in series and FIG. 17 shows a circuit diagram of this configuration. Each LED 1 has a planar shape of a rectangle and an air bridge line 28 connects between two LEDs. An electrode 32 is formed near each LED 1 and the electrode 32 and the LED 1 form a rectangular region. In other words, the electrode 32 occupies a portion of the rectangular region and the LED 1 is formed in the other portion in the rectangular region.

Figure 18:
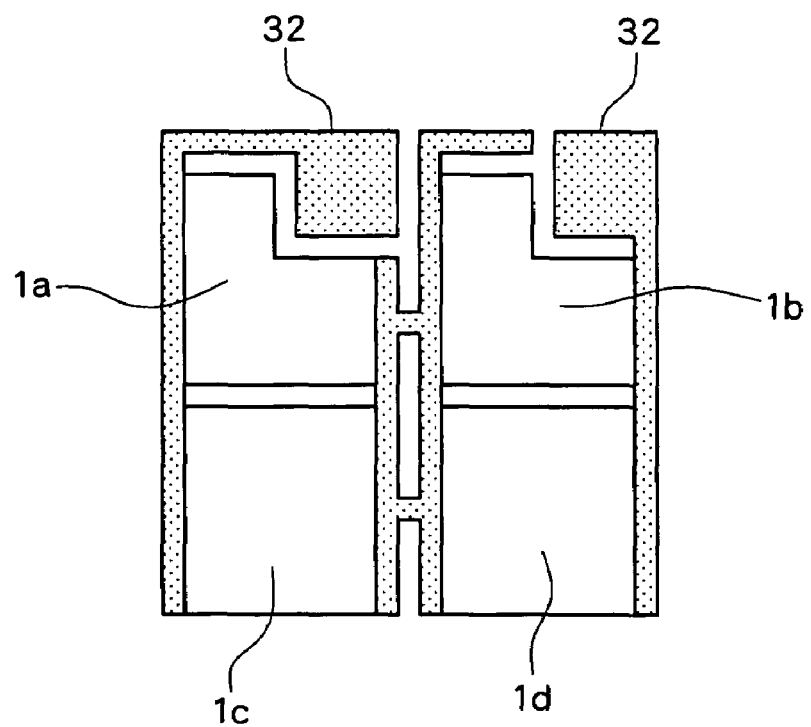
FIG. 18 is an explanatory diagram of a structure in which 4 LEDs are arranged in a two-dimensional pattern.
Figure 19:
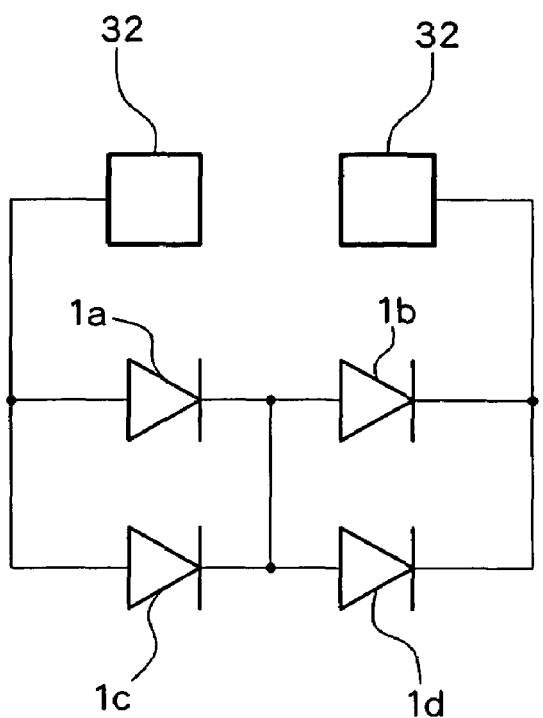
FIG. 19 is a circuit diagram of the structure shown in FIG. 18.

FIG. 18 shows a configuration in which 4 LEDs are arranged in a two-dimensional pattern and FIG. 19 shows a circuit diagram of this configuration. In this configuration, each of the LEDs 1 of FIG. 16 is divided into two LEDS and the two LEDs are connected in parallel. This configuration can also be described as two LED arrays each of which is made of two LEDs connected in parallel in the forward direction. The LEDs 1a and 1b form one LED array and the LEDs 1c and 1d form another LED array. The LEDs 1a and 1c share a p electrode 22 and an n electrode 24 and LEDs 1b and 1d also share a p electrode 22 and an n electrode 24. With this configuration, there is an advantage in that the current is more uniform compared to the configuration of FIG. 16.

Figure 20:
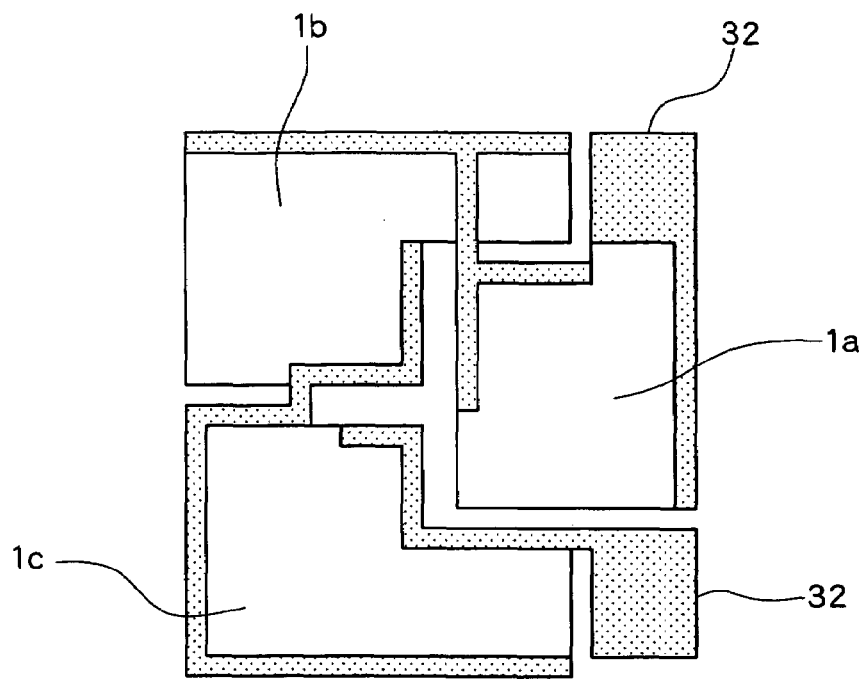
FIG. 20 is an explanatory diagram of a structure in which 3 LEDs are arranged in a two-dimensional pattern.
Figure 21:
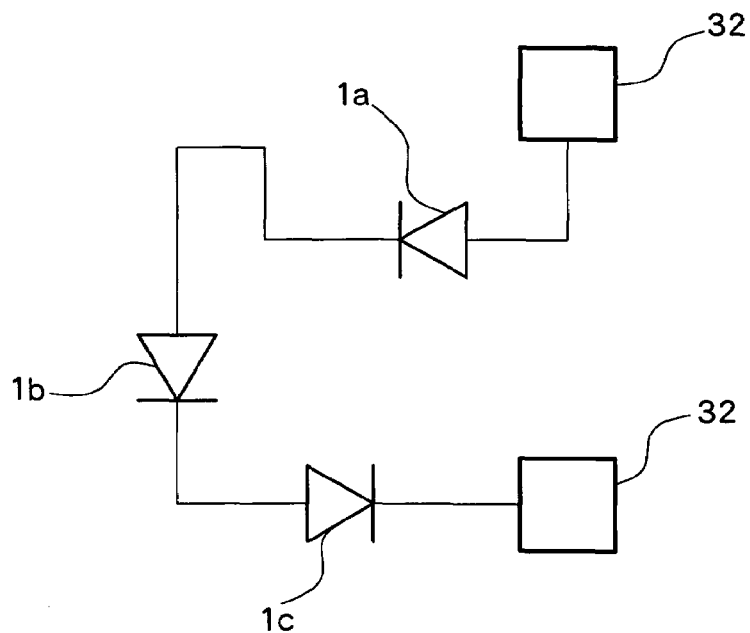
FIG. 21 is a circuit diagram of the structure shown in FIG. 20.

FIG. 20 shows a configuration in which three LEDs are arranged in a two-dimensional pattern and FIG. 21 shows a circuit diagram of this configuration. LEDs 1a, 1b, and 1c do not have the same shape and an electrode 32 is formed in a portion of the LED 1a. An n electrode 24 of the LED 1a is connected to a p electrode of the LED 1b by an air bridge line 28 striding over the LED 1b. By devising the shape and arrangement of the LEDs, even with 3 LEDs, the overall outer shape of the light emitting device (chip) can be formed in an approximate square.

Figure 22:
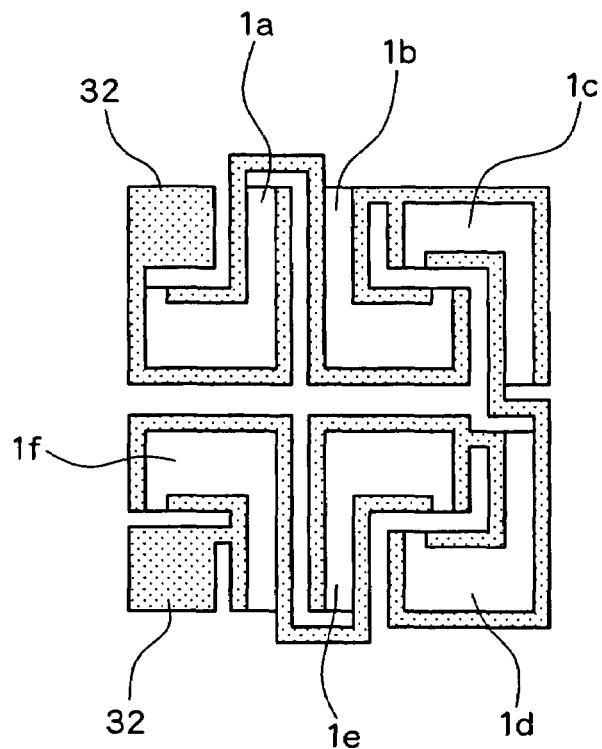
FIG. 22 is an explanatory diagram of a structure in which 6 LEDs are arranged in a two-dimensional pattern.
Figure 23:
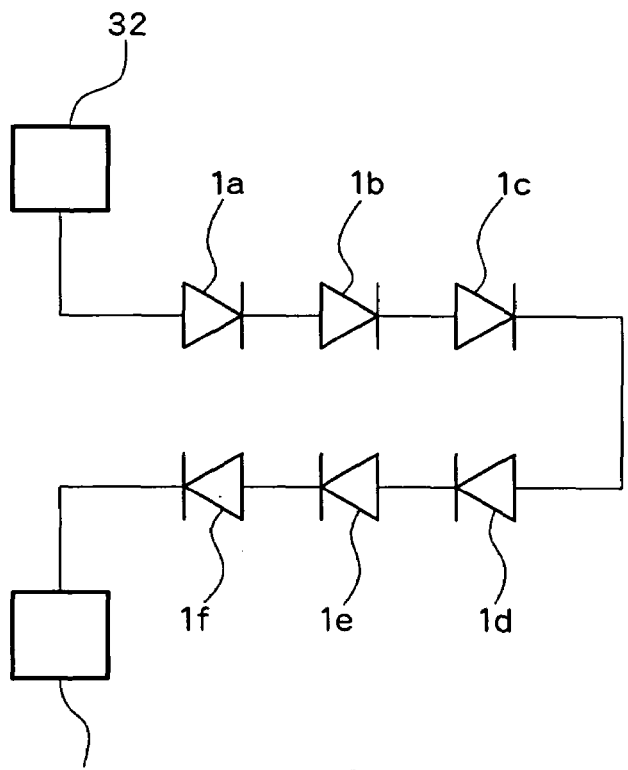
FIG. 23 is a circuit diagram of the structure shown in FIG. 22.

FIG. 22 shows a configuration in which a total of 6 LEDs are arranged in a two-dimensional pattern and FIG. 23 shows a circuit diagram of this configuration. The LEDs 1a-1f have the same shape and same size and are, connected in series. The LEDs 1a-1c are placed on a straight line and the LEDs 1d-1f are placed on another straight line. The LEDs 1c and 1d are connected by an air bridge line 28. In this configuration also, the overall shape of the chip can be made approximate square.

Figure 24:
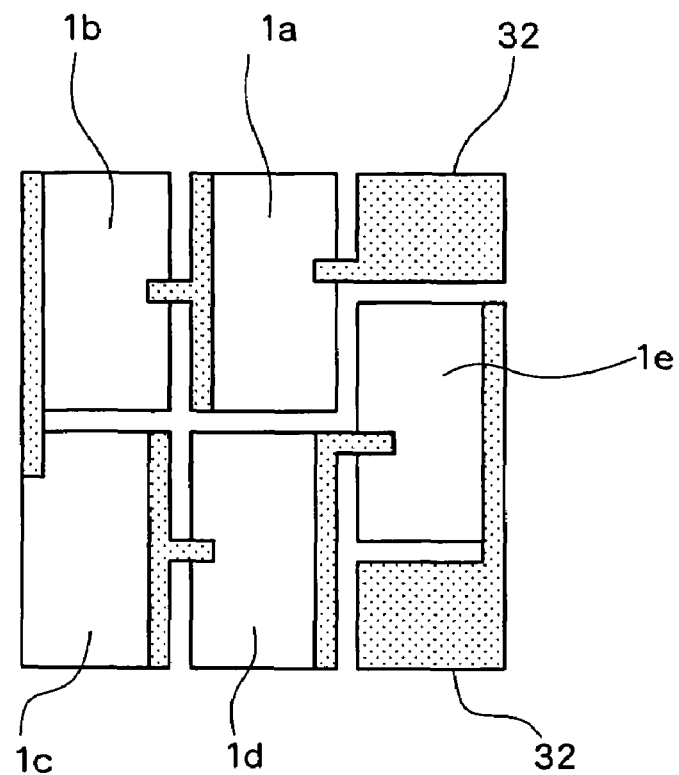
FIG. 24 is an explanatory diagram of a structure in which 5 LEDs are arranged in a two-dimensional pattern.
Figure 25:
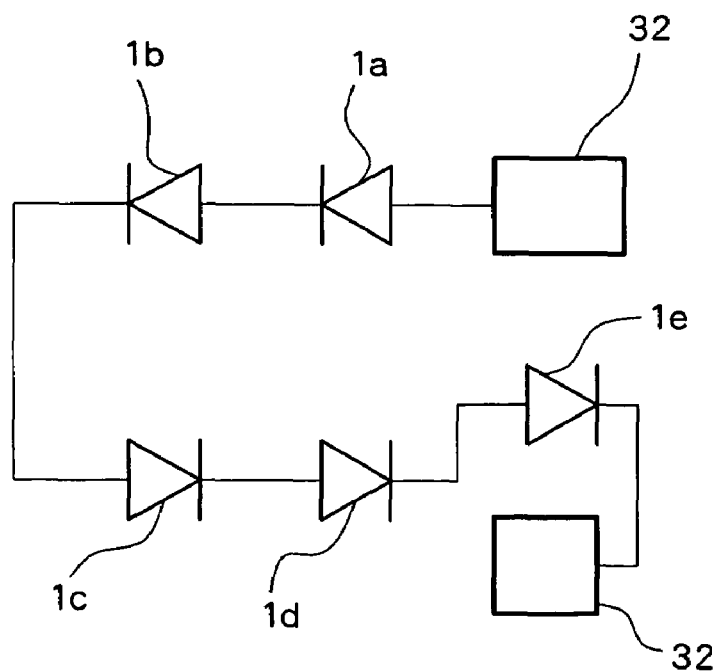
FIG. 25 is a circuit diagram of the structure shown in FIG. 24.

FIG. 24 shows a configuration in which a total of 5 LEDs are arranged in a two-dimensional pattern and FIG. 25 shows a circuit diagram of this configuration. LEDs 1a-1e have the same shape (rectangle) and the same size. In this configuration also, the overall shape can be made approximate square.

A preferred embodiment of the present invention has been described. The present invention is not limited to the preferred embodiment and various modifications can be made. In particular, the pattern when a plurality of light emitting elements (LED or the like) are arranged in a two-dimensional pattern may be patterns other than the ones described above. In this case, it is preferable to share electrodes between adjacent light emitting elements to reduce the amount of wiring, form the overall shape in square or rectangle, connect a plurality of groups of light emitting element arrays between electrodes in parallel, arrange the plurality of light emitting element arrays in opposite polarities when AC driven, combine the plurality of groups of light emitting element arrays by bending the light emitting element arrays in a zigzag pattern, etc.

Figure 26:
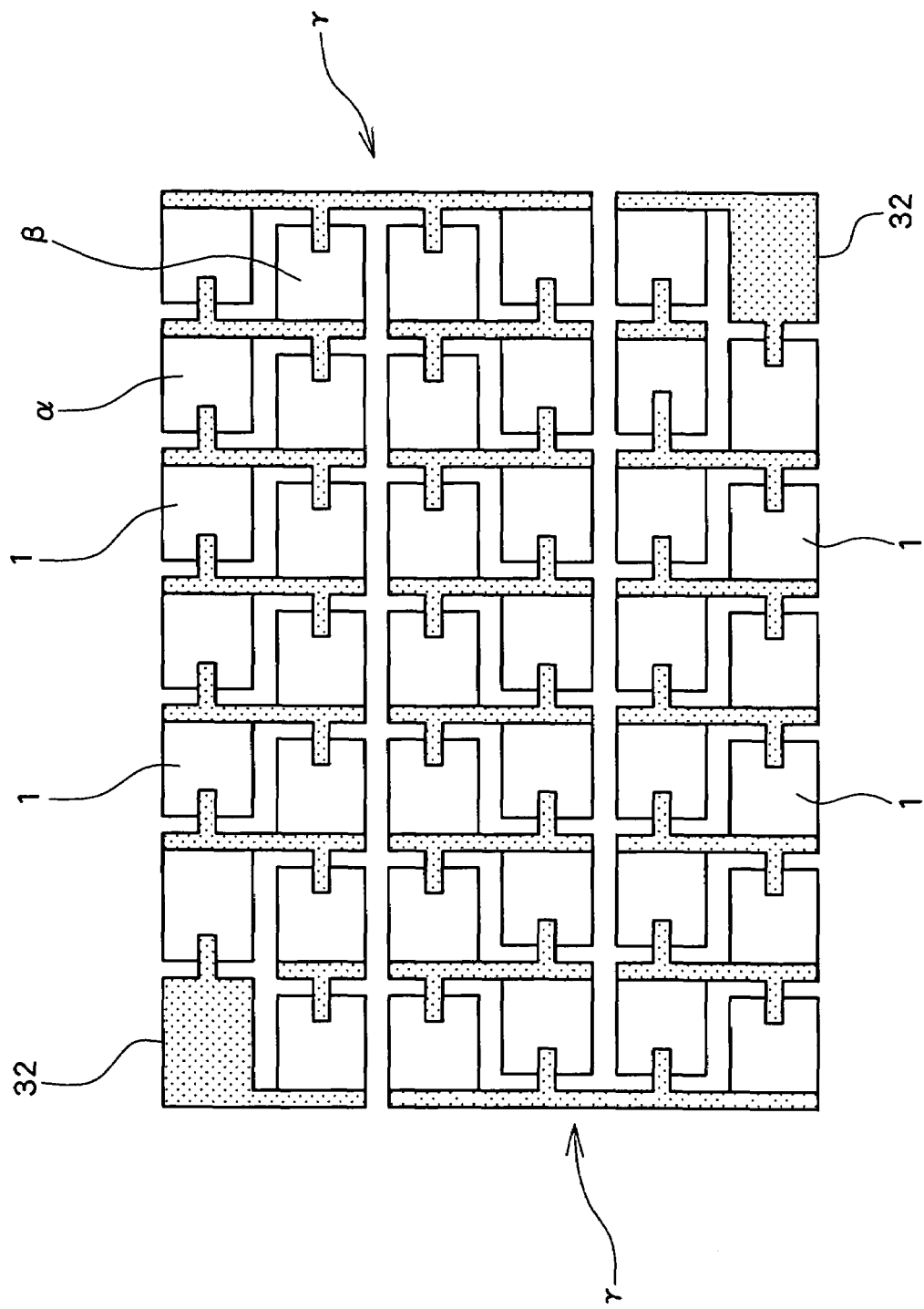
FIG. 26 is an explanatory diagram of another two-dimensional arrangement.
Figure 27:
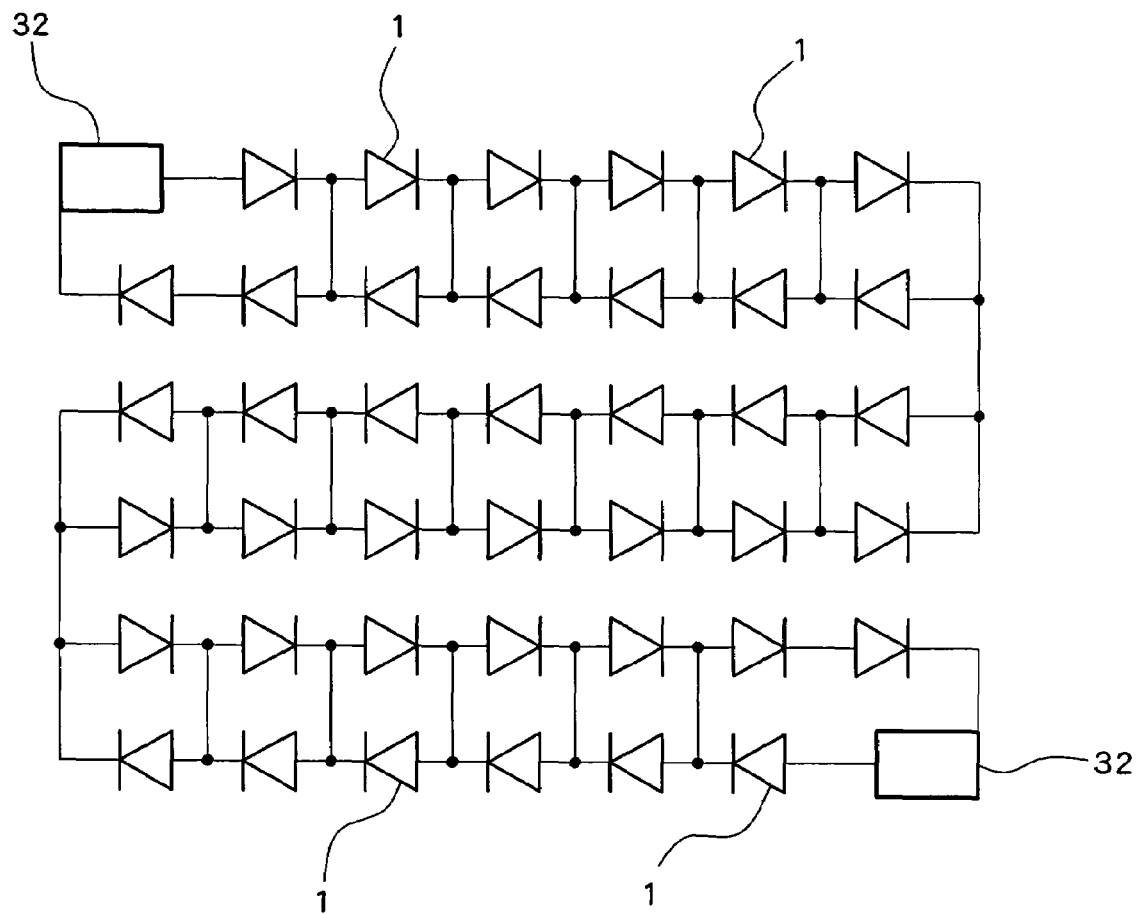
FIG. 27 is a circuit diagram of the structure shown in FIG. 26.

FIGS. 26-31 exemplify some of these alternative configurations. FIG. 26 shows a two-dimensional arrangement in an example employing AC drive of a total of 40 LEDs. FIG. 27 is a circuit diagram of this configuration. The configuration of FIG. 26 differs from that of FIG. 6 in that some of the two groups of LED arrays share the n electrode 24 (refer to FIG. 5). For example, an n electrode 24 of a second LED from the right of the first row of the first LED array (shown in the figure by α) is shared as the n electrode 24 of the rightmost LED of the first row of the second LED array (shown in the figure by β). Air bridge lines 28 at the ends of the LED arrays (shown in the figure by γ) are commonly formed without crossing.

Figure 28:
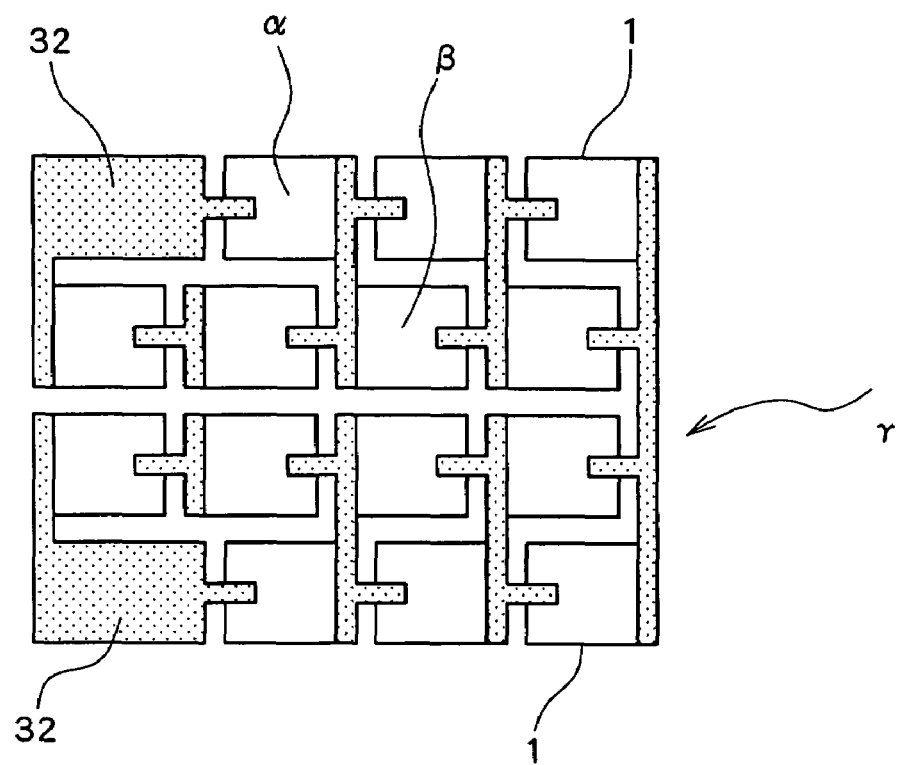
FIG. 28 is an explanatory diagram of another two-dimensional arrangement.
Figure 29:
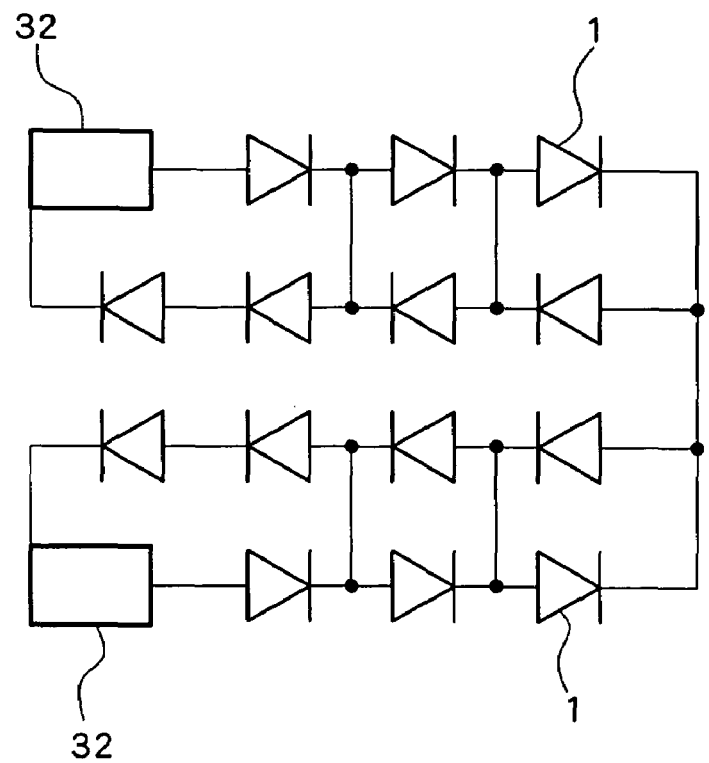
FIG. 29 is a circuit diagram of the structure shown in FIG. 28.

FIG. 28 shows a two-dimensional arrangement in a configuration employing AC drive and a total of 14 LEDs. FIG. 29 is a circuit diagram of this configuration. The configuration of FIG. 28 differs from that of FIG. 10 in that some of the two groups of LED arrays share the n electrode 24. For example, an n electrode 24 of the leftmost LED on a first row of a first LED array (shown in the FIG. by α) is shared as an n electrode 24 of an LED located second from the right on a first row of a second LED array (shown in the figure by β). Air bridge lines 28 at the ends (shown in the figure by γ) are commonly formed.

Figure 30:
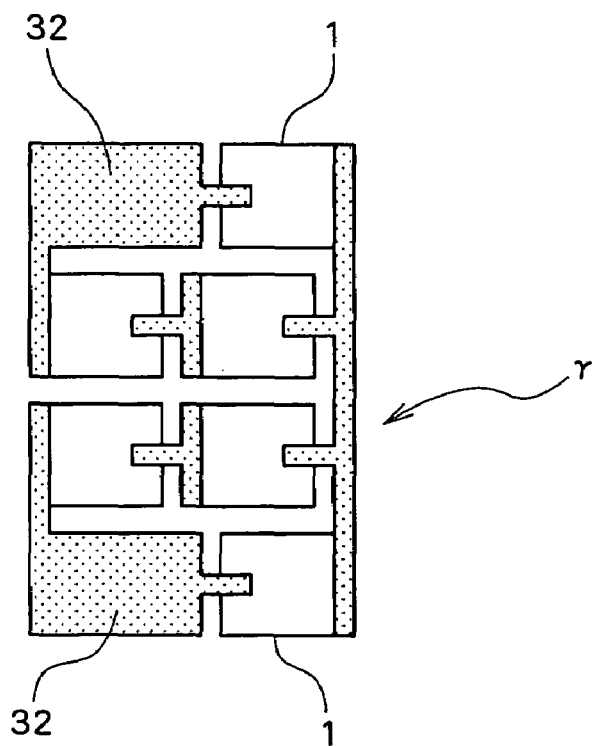
FIG. 30 is an explanatory diagram of another two-dimensional arrangement.
Figure 31:
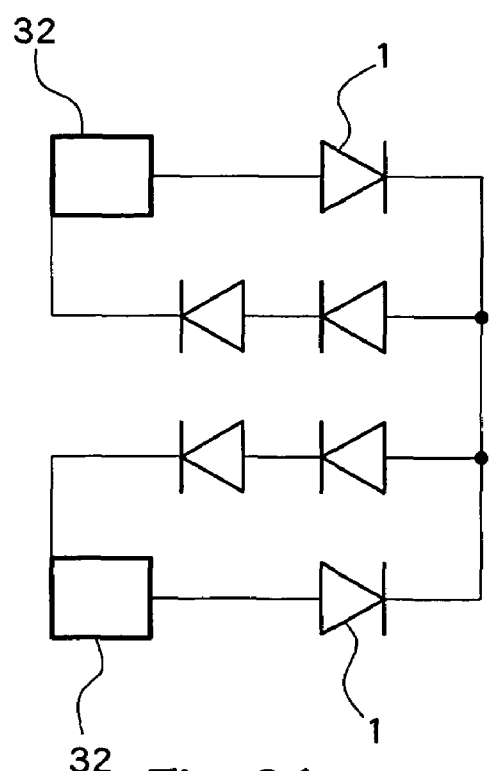
FIG. 31 is a circuit diagram of the structure shown in FIG. 30.

FIG. 30 shows a two-dimensional arrangement in a configuration employing AC drive and a total of 6 LEDs. FIG. 31 is a circuit diagram of this configuration. In this configuration also, air bridge lines 28 at the ends (γ portion) are commonly formed. It can be considered that in this configuration also, an n electrode 24 in the first LED array and an n electrode 24 of the second LED array are shared.

The invention claimed is:

1. A light emitting device comprising a plurality of GaN-based light emitting elements formed on an insulating substrate,
    wherein the plurality of light emitting elements are monolithically formed,
    wherein the plurality of light emitting elements form two groups, within each of the two groups the light emitting elements being connected in series,
    wherein the plurality of light emitting elements are arranged in a two-dimensional pattern on the substrate, and
    wherein each group has an array of light emitting elements placed in a zigzag pattern, and the two groups of light emitting element arrays are connected between two electrodes in parallel so that they are of opposite polarities.

2. The light emitting device according to claim 1, wherein the two groups of light emitting element arrays are alternately placed.

3. The light emitting device according to claim 1, wherein each of the light emitting elements and the electrodes has a substantially square, planar shape.

4. The light emitting device according to claim 1, wherein each of the light emitting elements and the electrodes has a substantially triangle, planar shape.

5. The light emitting device according to claim 1, wherein an overall shape of the plurality of light emitting elements and the electrodes is substantially square.

6. The light emitting device according to claim 1, wherein at least one of the electrodes is an electrode for an alternate current power supply.

7. The light emitting device according to claim 1, wherein the two groups of light emitting element arrays have a common n electrode.

8. The light emitting device according to claim 1, wherein the plurality of light emitting elements are connected by air bridge lines.

9. The light emitting device according to claim 1, wherein the plurality of light emitting elements are electrically separated by sapphire which is used as the substrate.

10. The light emitting device according to claim 1, wherein the two groups have equal numbers of light emitting elements.

* * * * *